(12) United States Patent
Hector, Jr. et al.

(10) Patent No.: US 11,903,176 B2
(45) Date of Patent: Feb. 13, 2024

(54) EMP PROTECTION FOR STRUCTURES HAVING COAL COMBUSTION RESIDUAL COMPONENTS

(71) Applicant: Go Team CCR, LLC, Raleigh, NC (US)

(72) Inventors: Francis Norbert Hector, Jr., Raleigh, NC (US); Davidson A. Scott, Stafford, VA (US)

(73) Assignee: GO TEAM CCR, LLC, Raleigh, NC (US)

( * ) Notice: Subject to any disclaimer, the term of this patent is extended or adjusted under 35 U.S.C. 154(b) by 0 days.

(21) Appl. No.: 18/048,054

(22) Filed: Oct. 20, 2022

(65) Prior Publication Data
US 2023/0084112 A1  Mar. 16, 2023

Related U.S. Application Data

(60) Continuation of application No. 17/693,892, filed on Mar. 14, 2022, now Pat. No. 11,523,549, which is a division of application No. 16/905,406, filed on Jun. 18, 2020, now Pat. No. 11,357,141, which is a continuation-in-part of application No. 16/711,581, filed on Dec. 12, 2019, now Pat. No. 10,765,045.

(60) Provisional application No. 62/883,696, filed on Aug. 7, 2019, provisional application No. 62/863,394, filed on Jun. 19, 2019.

(51) Int. Cl.
*H05K 9/00* (2006.01)

(52) U.S. Cl.
CPC ................... *H05K 9/0003* (2013.01)

(58) Field of Classification Search
CPC .................................................. H05K 9/0003
See application file for complete search history.

(56) References Cited

U.S. PATENT DOCUMENTS

| | | | | |
|---|---|---|---|---|
| 2006/0186884 A1* | 8/2006 | Mallett | ............... | H05K 9/0003 324/318 |
| 2009/0152000 A1* | 6/2009 | Loughry | ............. | H05K 9/0003 361/725 |
| 2012/0192516 A1* | 8/2012 | Hillers | ................ | E04B 1/90 52/309.4 |
| 2016/0234977 A1* | 8/2016 | Tuan | ................ | B28B 23/02 |
| 2021/0282303 A1* | 9/2021 | Sadler | ................ | H05K 9/0003 |

* cited by examiner

*Primary Examiner* — Hung V Ngo
(74) *Attorney, Agent, or Firm* — Shumaker, Loop & Kendrick, LLP; S. Alexander Long, Jr.

(57) ABSTRACT

An electromagnetic emission shield for protecting a facility having a volume comprised of coal combustion residue. The shield includes a carbon-based material positioned inside an interior space of the coal combustion residue proximate to and interposed between a potential source of electromagnetic emission and the facility.

8 Claims, 22 Drawing Sheets

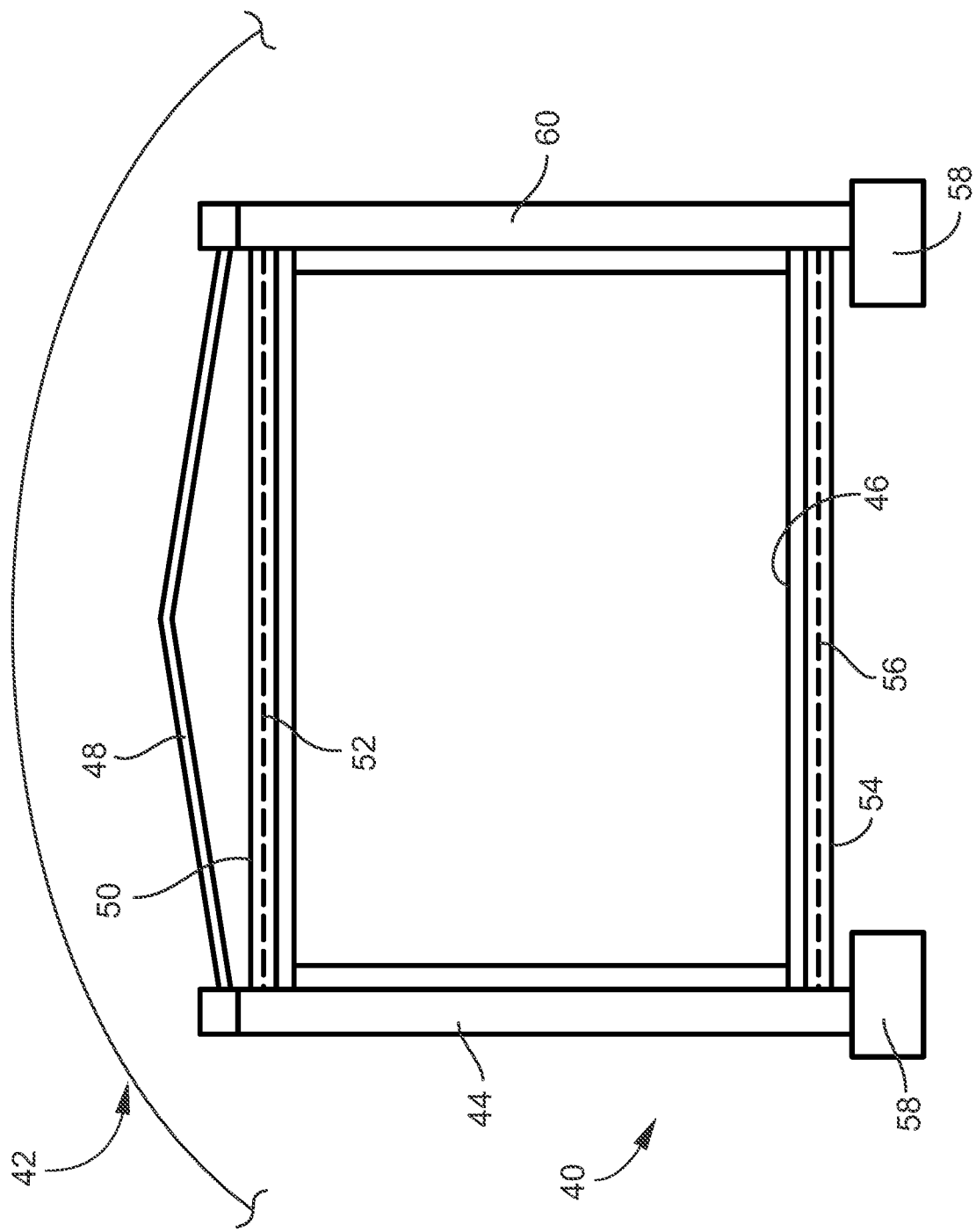

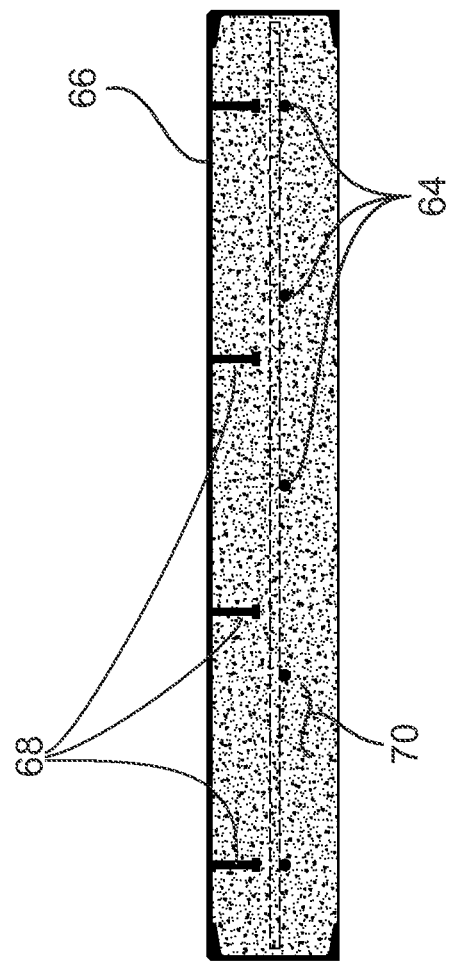
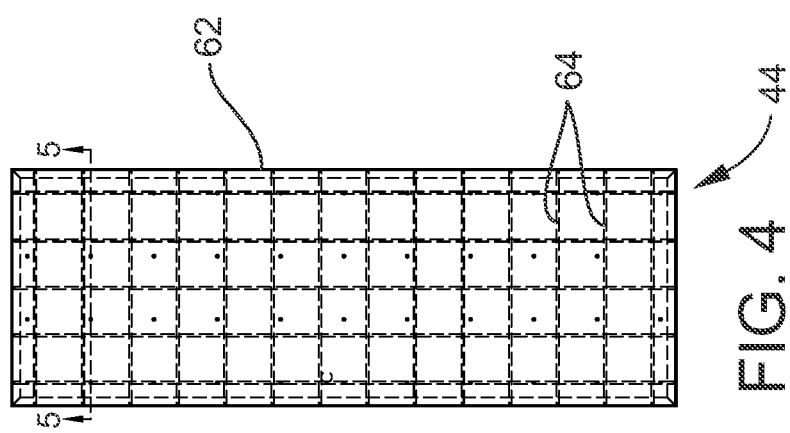

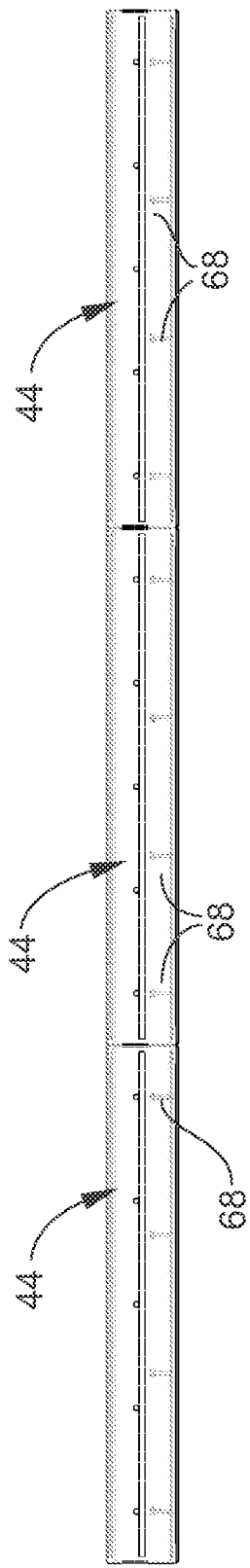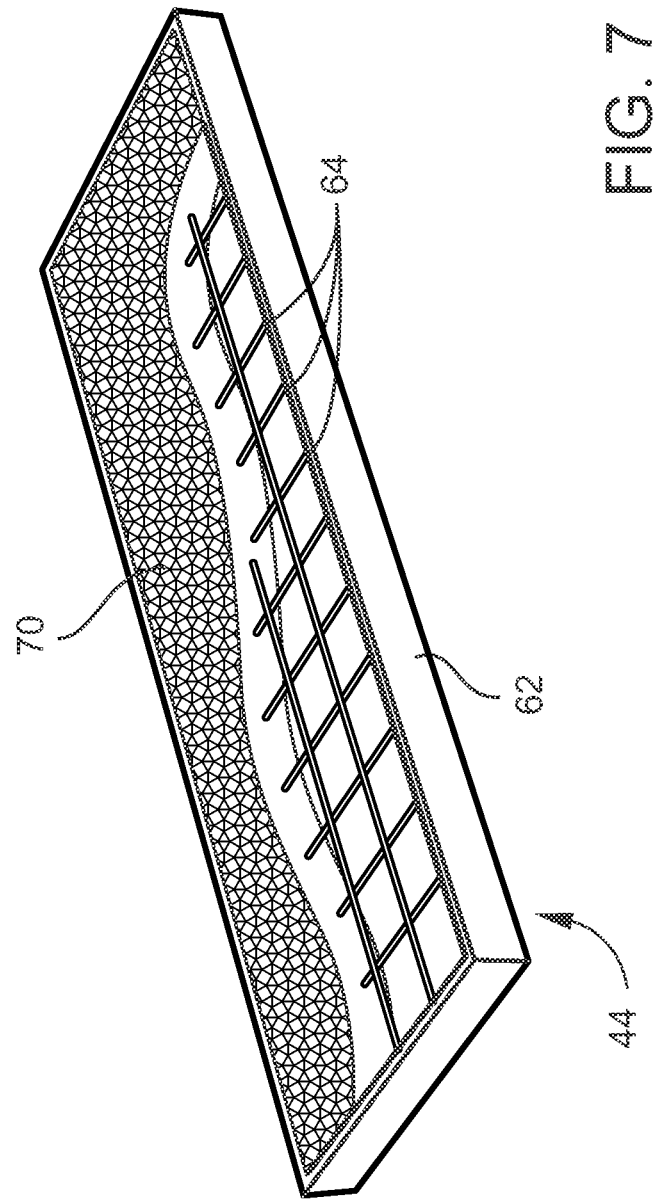

EMP PROTECTION FOR STRUCTURES HAVING COAL COMBUSTION RESIDUAL COMPONENTS

CROSS REFERENCE TO RELATED PATENT APPLICATIONS

This application is a continuation application tracing priority to co-pending U.S. Application having Ser. No. 17/693,892 filed on Mar. 14, 2022 which itself is a divisional application tracing priority to United States Application having Ser. No. 16/905,406 filed on Jun. 18, 2020, now U.S. Pat. No. 11,357,141, which itself claims priority to United States Provisional Application having Ser. No. 62/863,394 filed on Jun. 19, 2019, and also claims priority as a continuation-in-part of United States Provisional Application having Ser. No. 16/711,581 filed on Dec. 12, 2019, now U.S. Pat. No. 10,765,045 which itself claims priority to United States Provisional Application having Ser. No. 62/883,696 filed on Aug. 7, 2019. This Application accordingly claims full benefit and priority as to each of these applications and patents and each of these respective applications and patents is hereby incorporated by reference in their entireties.

TECHNICAL FIELD AND BACKGROUND OF THE INVENTION

This invention relates to shielding structures against radiation by the use of radiation absorbing coal combustion residual components ("CCR"). More specifically, this invention relates to shielding against electromagnetic pulses (EMP), high-altitude electromagnetic pulses (HEMP), geomagnetic disturbances (GMD), and intentional electromagnetic interferences (IEMP). The application discloses structures utilizing CCR as a radiation-absorbing material per se, and also techniques for enhancing the EMP protection afforded such structures. Examples of structures utilizing CCR are disclosed in applicant's U.S. Pat. Nos. 9,790,703 and 9,988,317.

The world has grown dependent upon the use of electronics in nearly every facet of life. Safety, security, and normal day-to-day life heavily involve the use of electronics. Accidental and intentional conducted and radiated electromagnetic or geomagnetic emissions are capable of introducing damaging high electrical currents and voltages. These high currents and voltages are capable of causing disruption, data loss, and even permanent damage to the targeted electronics. An increased level of research and development is being carried out to protect critical structures, facilities, and components against these harmful emissions.

Prior art protection against radiation-induced damage has included geographic separation, redundancy, technical workarounds, or repair procedures as long as parts are available. This application discloses constructing an Intentional Electro-Magnetic Interference (IEMP) protective barrier using Coal Combustion Residuals (CCR) as a major component. These barriers can be constructed around EMP protective, or non-protected EMP structure(s) to provide the additional IEMP protection. IEMP walls can be used to protect many types of critical infrastructure systems as outlined by CISA but specifically control centers and electrical substations for utilities will be a sector that IEMP protective structures will provide much needed protection.

It has been verified by testing that CCR Absorbs IEMP electromagnetic energy at a greater effective rate than common soils. This greater absorption characteristic of CCR allows for a superior IEMP protective barrier and at the same time allows for the beneficial use of CCR. The IEMP barriers can be built with spaced, framed panels, but the preferred embodiment is to construct an IEMP protective barrier berm using CCR. Using CCR in this beneficial use will allow not only for IEMP protection but also protection from other destructive forces that an adversary may use to damage critical infrastructure, as was perpetrated on Apr. 16, 2013 by the Metcalf sniper attack on Pacific Gas and Electric Company's Metcalf Transmission substation in Coyote, California.

The variables for IEMP protective construction apply regarding liners, liner placement, encapsulation, low leaching/low permeability, slope stability, mesh, and mesh placement.

Protection against radiated and conducted electromagnetic Emissions such as HEMP/EMP, GMD, and IEMP can be accomplished by the electromagnetic shielding methods and devices described in this application. Shielding can be applied to CCR facilities and the components, systems, and subsystems which make up the facility and/or the CCR material itself. Shielding against radiated emissions is accomplished through creating a highly conductive surface around a protected area to reflect and/or absorb radiated energy so it does not cause damage. The highly conductive surface is able to redirect and/or absorb the radiated energy to prevent or minimize exposure to damaging electromagnetic energy. Conducted emissions are generally diverted or blocked through the use of filters with discrete components that pass desired energy and block undesirable or damaging energy before it enters a protected area. Shielding of radiated and conducted Emissions can be accomplished through one or a combination of methods and devices described in this invention.

Additionally, EMP has three components which are commonly referred to as E1, E2, and E3. These components vary by frequency, intensity, and longevity. Shielding against each of these components may be accomplished by different methods and techniques. One or multiple layers of conductive mesh may be positioned around the entire CCR structure, within the CCR material itself, around specific components or subsystems, or in natural earth geotechnical formations below or otherwise proximate to the CCR structure. Generally, conductive mesh will provide shielding from EMP events in a lower frequency range; however the size of the free air space within the mesh, commonly known as the mesh size, will be selected based on the desired frequency ranges that are required to be protected against.

SUMMARY OF THE INVENTION

It is therefore an object of the present invention to provide shielding against harmful radiated and conducted electromagnetic and geomagnetic emissions to structures by incorporating CCR components into these structures.

It is another object of the present invention to provide EMP, HEMP, GMD, and/or IEMP shielding to structures having CCR components.

These and other objects and advantages of the present invention are achieved in the preferred embodiments set forth below by providing an electromagnetic emission shield for protecting a coal combustion residue facility having a carbon-based material. The shield may be formed into an arch and positioned inside an interior space of the coal combustion residue facility and a plurality of conductive mesh layers embedded into the carbon-based material.

In another embodiment of the invention an electromagnetic emission shield for protecting a coal combustion residue facility has a layer of carbon-based material positioned underneath the coal combustion residue facility and a plurality of conductive mesh layers embedded into the carbon-based material.

According to another embodiment of the invention, an electromagnetic emission shield is provided for protecting a facility having a volume comprised of coal combustion residue, the shield comprising a carbon-based material positioned inside an interior space of the coal combustion proximate to and interposed between a potential source of electromagnetic emission and the facility.

According to another embodiment of the invention, at least one electro-conductive mesh is embedded into the carbon-based material.

According to another embodiment of the invention, the shield comprises an enclosure having a weight-bearing arched roof.

According to another embodiment of the invention, the shield includes an enclosure having a weight-bearing arched roof, vertical side walls surrounding the facility, and a slab floor.

According to another embodiment of the invention, the slab floor is undergirded with coke breeze in which is embedding an electro-conductive mesh.

According to another embodiment of the invention, vertical side walls are welded to the roof.

According to another embodiment of the invention, an EMP-protective composite structure is provided and includes at least one enclosure having walls, a ceiling, at least one ingress/egress portal and a base, each of the walls, the ceiling, the ingress/egress portal and the base including at least one blast-resistant structural panel and at least one layer of an EMP barrier comprised of CCR that provides magnetic conduction, field absorption and field reflection fully-enclosing the structural panel. The blast-resistant structural panel includes a frame constructed of spaced-apart frame members of a ferrous material, frame reinforcing members extending between the frame members, a cementitious layer in which the frame is embedded and an EMP absorbing mesh embedded in the cementitious layer. An encapsulation barrier includes an overlying layer of an impermeable cementitious material having a blast-deflecting surface defining an acute blast-deflecting angle with respect to a major plane of the base overlying the at least one enclosure, and a HEMP protective door is formed in the enclosure to absorb and deflect EMP.

According to another embodiment of the invention, the encapsulation barrier comprises an overlying layer of an impermeable cementitious material and a layer of vegetation overlying the layer of impermeable cementitious material.

According to another embodiment of the invention, the blast-resistant structural panel includes an expansion joint extending along a major side thereof for joining the structural panel to a like structural panel that allows for movement of the structural panel relative to other joined structural panels due to expansion and contraction while maintaining intact EMP protective features.

According to another embodiment of the invention, the enclosure includes a plurality of structural panels joined to form enclosed spaces equipped to perform the functions selected from the group of enclosed spaces consisting of operations center, living quarters, communications, data center, mess hall, kitchen facilities, restroom, shower facility, laundry, storage for food, water, medical supplies and equipment, apparel and hygiene-related supplies and equipment, generators, battery storage, transformers, power substation, power plant SCADA system; fuel supply, storage for spare and replacement parts for operating equipment.

According to another embodiment of the invention, a circuitous path extends from an exterior of the EMP-protective structure, through the encapsulation barrier and to the at least one ingress/egress portal of the enclosure, the circuitous path configured to absorb and deflect EMP as the EMP passes along the circuitous path, wherein the circuitous path comprises a labyrinth having a plurality of right-angle turns though the EMP barrier that provides magnetic conduction, field absorption and field reflection with respect to radiation entering the path from the exterior of the EMP-protective structure.

According to another embodiment of the invention, a structural panel for use in constructing an EMP-protective composite structure is provided, the structural panel including spaced-apart frame members of a ferrous material, frame reinforcing members extending between and connecting the spaced-apart frame members; and a cementitious layer in which the frame is embedded.

According to another embodiment of the invention, an EMP absorbing mesh is embedded in the cementitious layer.

According to another embodiment of the invention, the blast-resistant structural panel includes an expansion joint extending along a major side thereof for joining the structural panel to a like structural panel that allows for movement of the structural panel relative to other joined structural panels due to expansion and contraction while maintaining intact EMP protective features.

According to another embodiment of the invention, an insulation layer is provided coextensive with a major surface of the panel.

According to another embodiment of the invention, the panel is adapted to be fabricated in a horizontal position and then tilted in situ into an upright position to form a part of the enclosure.

According to another embodiment of the invention, the cementitious layer is selected from the group consisting of lightweight concrete, epoxy concrete, ultra-high performance concrete and autoclave concrete.

BRIEF DESCRIPTION OF THE DRAWING FIGURES

The present invention is best understood when the following detailed description of the invention is read with reference to the accompanying drawings, in which:

FIG. 3 is a side elevation/cross section of an EMP protective structure incorporating EMP absorbing materials such as coal combustion residuals and coke breeze;

FIG. 4 is a front view of a wall section for use in EMP absorbing materials such as coal combustion residuals and coke breeze;

FIG. 5 is a side elevation of the wall section shown in FIG. 4;

FIG. 6 is a top view of three wall sections of FIGS. 4 and 5;

FIG. 7 is a perspective view with parts cut away of the wall section of FIGS. 4 and 5;

GENERAL DESCRIPTION OF THE PREFERRED EMBODIMENTS

Figure 2:
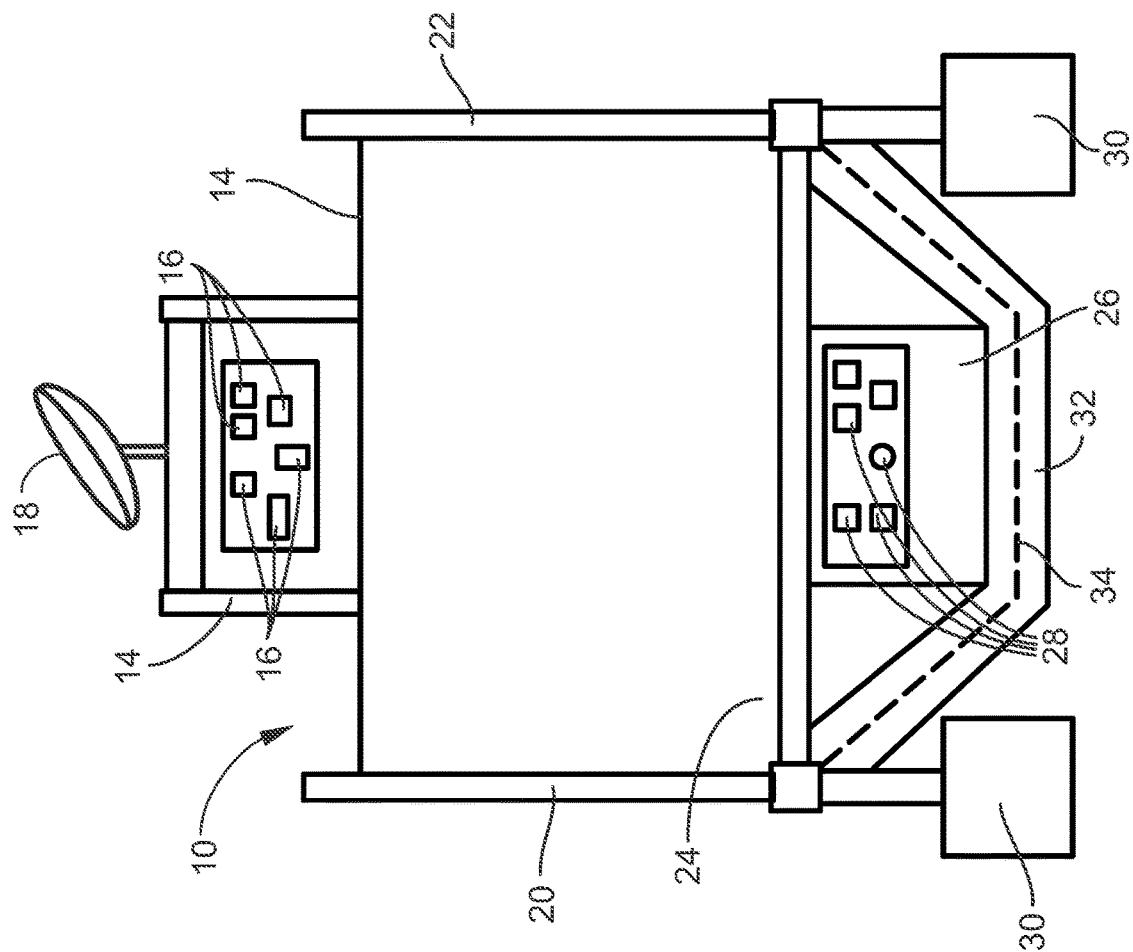
FIG. 2 is a side elevation/cross section of the protective structure shown in FIG. 1.

The embodiments shown in the drawing figures have certain features in common which are described below before providing specific details of the individual drawings. In general, enhanced radiation absorption in CCR structures is achieved by use of various panels and walls that include a radio-absorbing mesh. The mesh may be welded, woven wire fabric, tied together with tie wire to form a continuous secure connection, formed with end loops having a threaded round or oval bar that runs perpendicular to the loops to tie the sections of mesh together, or formed with a hook and claw method. The mesh may be made of carbon steel, or any other material that can effectively conduct electricity and/or magnetic fields. The mesh may be coated and/or dipped to prevent corrosion. Corrosion may be due to the varying PH balances in the CCR material. Commercially available industrial coatings are envisioned as well as specifically developed coatings.

Conductive material, other than meshes, which produce the same or similar results, may be placed within the CCR structure, components, or CCR material itself. Shredded scrap metal, such as from vehicle shredders, steel fibers, textured glass, and other similar products can be utilized in and around structures having CCR components. Textured glass and shredded scrap metal may be used. These materials can be mixed directly into the CCR material itself, or formed into defined sections placed in and/or around the structure, for example arched, vertical, and/or horizontal formations. The material could also be placed in a section of soil located in the CCR structure or below the slab-on-grade portion of the interior structure which may be designed to be in a carbon-based material (a.k.a. carbon-containing material), other than CCR, CCR and soil, or any other acceptable material that will provide the desired shielding.

EMP absorption may be optionally enhanced by various additives and constructions which increase carbon content of the CCR structure. Some CCR structures already have high carbon content and may not require any enhancement. A carbon-based material, such as coal coke breeze or pet coke, may be in the form of an additive within the CCR material itself, or positioned as a defined construction proximate to or within the interior space of the CCR structure to enhance absorption within a defined frequency range. Carbon-based material may be used singularly or in combination with other carbon enhancing materials. It is also envisioned that carbon-based material may be attached to a liner or other barrier.

CCR material compositions typically vary in carbon content within a specific site or different sites. This variation may determine the size, type, and/or thickness of other elements of the CCR shielding required. These variables will be the main determining factors in the amount and extent of any carbon enhancing material required.

An arch is one specific technique for providing shielding of the type envisioned in this application. The percentage of carbon in the arch may be determined by the aforementioned site-specific variables, or a general predetermined amount, and the placement of the interior spaces in relationship to the bottom of the CCR. It is envisioned that the other shapes or configurations such as vertical sides and horizontal top/bottoms may be utilized in combination with arch structures. Construction of vertical wall/panel sections may be accomplished by using construction trench boxes. A floor shield may also be formed of mesh and/or a defined layer of a carbon-based material positioned underneath the floor of the interior structure. The entire mass of CCR material itself can be increased in carbon content in lieu of placement within the CCR structure depending on the type and amount of electromagnetic shielding required.

A combination of carbon enhancing material and mesh may be utilized to prevent electromagnetic or geomagnetic forces from penetrating upwards into the interior spaces of the CCR structure. While two layers of mesh and three layers of carbon enhancing material are shown, the amount, type, and thickness of the layers is dependent upon site specific requirements. The mesh may be fastened to sheet piling by welding, bolted bus bar type connection, and/or any other fasteners that are capable of producing a continuous metal to metal connection. Mesh from the exterior side of the interior space wall may be connected at an equal elevation or a lower elevation point to create a continuous 360 degree shielding around the interior spaces.

When the interior spaces of a CCR structure are constructed out of precast concrete or poured-in-place concrete, a metal plate may be inserted into the concrete to have a connection point for the mesh on both the interior and exterior sides of the interior space. Often it is necessary to test the properties of the installed shielding. A system for testing may be integrated into the CCR facilities for continuous or discrete testing. One testing system has multiple loop coils which may be energized so that the amount of energy emanating into the protected areas may be measured. These measurements enable the shielding effectiveness to be calculated so that the integrity of the shielding can be determined. Testing may also be accomplished by directly energizing conductive meshes around the facility using different frequencies and power levels so that shielding effectiveness may be calculated in protected areas to give confidence in the overall level of shielding that is present inside the CCR structure.

Radio frequency (RF) absorption can be tested using specially fabricated probes. These probes use copper tubes that have a pre-determined cross section diameter and length (for example, 1 inch in diameter and 10 feet in length) with caps and/or attachments that allow for the use of demountable components such as RF-type connectors, clips, or other means of connecting/disconnecting the probes.

The probes are energized with RF energy of any frequency. A typical frequency range is from 10 kHz to 1 GHz. RF energy is injected on one end of the probe, and the remaining energy is removed on the opposite end of the probe. The probes can be used to characterize the absorption properties of any material. The difference between injected energy and harvested energy is the absorption of energy along the probe. When the probe is placed or buried within various materials the inherent ability to absorb RF of the material surrounding the probe may be determined when a frequency of a predetermined bandwidth is swept across the spectrum.

Additionally, when the probes are buried in CCR, the ability of CCR to absorb, for example, HEMP/EMP energy from 10 kHz to 1 GHz can be determined. This allows for the suitability of CCR for HEMP shielded structures to be determined.

Air and/or personnel entryways into the CCR structure may be created through the use of an RF absorber in conjunction with a Waveguide Below Cutoff (WBC). The entryway will be comprised of an RF absorber, such as encapsulated CCR, coke breeze, MET coke, PET coke (containing varying percentages of carbon) or other carbon or non-carbon absorbing material with welded steel or welded steel mesh embedded in the RF absorber and configured to create a WBC. The entryway will function such that low frequency electromagnetic waves will be blocked by the WBC and higher frequency electromagnetic waves (above the cutoff frequency) will be absorbed by the RF absorber thereby creating a personnel or air entryway capable of blocking RF energy without utilizing an RF door. The entryway path may or may not curve or turn to help facilitate RF absorption. The entryway may include rudimentary RF shielding doors, turnstiles, or other RF absorbing features to improve overall RF shielding performance.

The removal of RF energy from wires, cables, conduits, pipes or other metallic fixtures may also be necessary. Wires, cables, conduits, pipes or other metallic fixtures may be embedded within materials such as encapsulated CCR, coke breeze, MET coke, PET coke (containing varying percentages of carbon) or other carbon or non-carbon absorbing material to significantly reduce high-frequency RF energy. This has applications for power lines, signal lines (such as those in power substations), control lines (such as those in power substations), and metallic pipes (such as water/sewer/gas lines) that may not be otherwise configured to exclude RF energy.

An electromagnetic filter may be created out of utility-grade discrete components. Air-core inductors, or other types of inductors that are of the type in use by electric utilities along with capacitors of the type that are used by electric utilities for power factor correction, or other purposes may be used to create a filter. This filter can be utilized independently or in conjunction with other filters to provide a range of frequencies or attenuation levels required by a particular application. One example is a HEMP filter (from 10 kHz to 1 GHz or more).

Medium-voltage power bus bars may be created to feed power into a CCR structure. The bus bar may be 10 ft or longer in length and of sufficient cross-section to transmit electrical power without excessive heating. The bus bar may not conduct significant amounts of RF energy. The bus bar may be insulated with nylon, PVC or other insulating material. The bus bar may be embedded in encapsulated CCR, coke breeze, MET coke, PET coke (containing varying percentages of carbon) or other carbon or non-carbon absorbing material which will act as an RF absorber and will prevent significant RF energy from being transmitted by the bus bar. The bus bar may be used in conjunction with the filter to operate across the entire HEMP pulse spectrum.

This arrangement might be used for applications like electric power substation houses where multiple conductors may need to pass from an unshielded area to a shielded area, and applications (such as high-speed protective relays) that may not be compatible with conventional filters, as is sometimes the case. Grounding shields from the cables would be removed for the portion of the conductors that pass through the carbon containing absorbing material. However, the carbon RF filter is utilized it will be configured so that one end is outside of the shielded environment, and the other end is inside the shielded environment Inside of the RF shielded environment, other protective devices, such as metal-oxide varistors may be employed to reduce any remaining RF artifacts. With higher frequency RF artifacts removed, MOVs may be effectively employed. Often when high-frequency artifacts are present, an MOV does not act fast enough to protect against conducted RF energy that may be damaging. With the higher frequency artifacts removed, the "rise time" of any RF energy will be significantly less, allowing for conventional and/or less expensive MOVs that have a slower rise-time response to be used to provide more effective protection to a conductor in a shielded environment.

One of the technical principles employed with this invention is called the "Skin Effect." The skin effect is the tendency of an alternating current, such as standard utility power and radio frequency energy, to become distributed within an electrical conductor in a way that the current is mostly carried near the surface of a conductor (aka: "the skin" of the conductor). The depth of the "skin" is dependent upon frequency of the electrical current—so DC power would utilize the whole conductor, utility AC power would have very limited skin effect, because it is low in frequency, and RF energy from an EMP or IEMP or other RF source would flow mainly on the outside of a conductor. By flowing on the outside of the conductor, the RF energy is closer to the carbon-containing material that absorbs the RF energy. This allows the RF energy to be removed from the conductors as it propagates across the conductor. Another technical principle employed with this invention is "re-radiation" of RF energy that is travelling down a conductor. As RF energy frequency increases, the tendency for RF energy to reradiate from conducted energy to energy traveling in free-space (or within some other medium in which a conductor is placed) as it travels along the conductor. When the energy reradiates in carbon-containing material, it is converted to heat by the carbon, which is the same principle that pyramidal carbon absorbers, commonly used in "anechoic chambers" or EMP testing chambers.

For applications with utility AC power or DC power from alternative energy (as examples, but not limited to these examples) the carbon-containing RF absorber will absorb any energy that is reradiated from a conductor inside of it. The effectiveness of the carbon-containing RF absorber will be dependent on the thickness of the RF absorber, with higher frequencies (that have a shorter wavelength) being absorbed by a shorter thickness of carbon material in which a given conductor may be embedded than for lower frequencies (with a longer wavelength).

The EMP Protective composite enclosure panel systems and materials in this application have unique features that allow for, if required, exceptional corrective and maintenance work which can be easily located and performed to allow for long-term Intentional Electro Magnetic Interference (IEMP) and EMP shielding, absorption and conductivity protection requirements of the system(s) for many decades, if not longer, to come.

IEMP weapons generally have a frequency spectrum from 80 MHz-10 GHz (or higher) and project either a narrow-band repetitive pulse, a wide-band repetitive pulse, or some other pulse modulation scheme designed to damage, disrupt, or upset electronic systems that are in their antenna focus area. The maximum field-strength beam of IEMP weapons is generally narrow (a few degrees wide in beam-width) and can often be aimed to focus on specific systems or areas of a building.

DETAILED DESCRIPTION OF THE PREFERRED EMBODIMENTS

Figure 1:
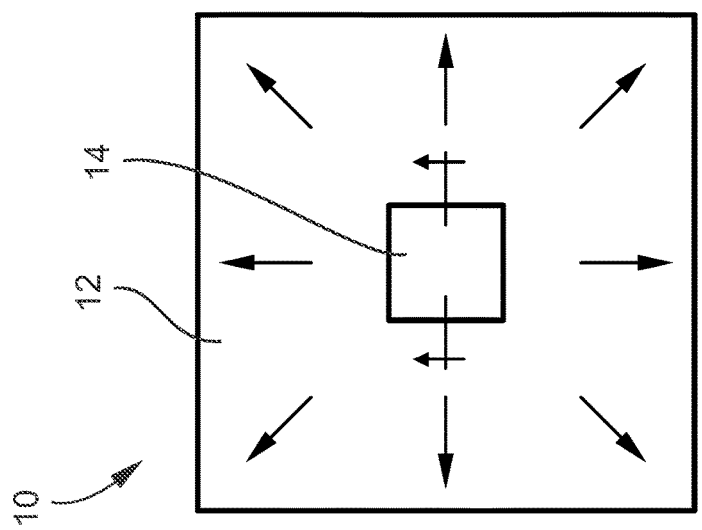
FIG. 1 is a top roof plan view of an EMP protective structure incorporating EMP absorbing materials such as coal combustion residuals and coke breeze.

Referring now specifically to the drawings, FIG. 1 is a roof plan of a structure 10 adapted to contain and protect any suitable facility from EMP. The structure 10 is surrounded by CCR acting as a primary EMP shielding (not shown). The structure 10 includes a roof 12 and a heavy, robust structure 14 that protrudes above the level of the roof 12 and contains wave guides 16 that are tuned to intercept EMP radiation at predetermined frequencies. The structure 14 may include a communications antenna 18, as shown.

FIG. 2 illustrates that the structure 10 includes vertical slab walls 20, 22 with a slab floor 24 set on grade. An EMP protector panel 26 is set below grade, as shown, and includes wave guides 28 that are tuned to intercept EMP radiation at predetermined frequencies. The structure 10 is anchored below grade by large foundation piers 30. A below grade foundation pad 32 is positioned under the EMP protector panel 26 and includes a slab of an EMP absorbing material such as coke breeze into which is embedded a mesh 34. The combination of the coke breeze and the mesh 34 provide enhanced EMP absorbing capability to the structure 10, which as noted above is embedding in a thick layer of CCR, not shown.

FIG. 3 is a side elevation/cross section of an EMP protective structure 40 incorporating EMP absorbing materials such as coal combustion residuals and coke breeze. The structure 40 is shown surrounded by a large, deep volume of CCR. The entire structure is shown encapsulated in an additional layer 42 of dirt and/or CCR. The structure 40 includes vertical slab walls 44, 46 with a slab floor 46 set on grade. The structure 40 also includes a lightweight, sloped concrete roof 48. The top of the structure 40 is enclosed with a slab 50 of coke breeze in which is embedded a mesh 52. The combination of the coke breeze and the mesh 52 provide enhanced EMP absorbing capability to the structure 40. Similarly, the slab floor 46 is undergirded with a slab 54 of coke breeze in which is embedding a mesh 56. The structure 40 is anchored below grade by large foundation piers 58.

The slabs 50 and 54 are welded to the roof 48 and vertical slab walls 44, 60, which are waterproofed concrete and steel.

The details of the slab walls, for example wall 44, are shown in FIGS. 4 and 5. As shown, wall 44 is formed of a rectangular steel frame 62 and includes a grid of mesh 64 formed of an interlocked array of rebar or similar interlocking elongate elements placed in the concrete inside of the frame 62. As best shown in FIG. 5, the frame 62 has a back wall panel 66 to which are welded concrete anchor studs 68. The frame 62 thus forms a shallow vessel into which concrete 70 is placed. This concrete 70 can be EMP protective with the addition of carbon-based material as part of the concrete mix design, can provide a redundancy of EMP protective above the back wall panel 66.

FIG. 6 is a top view of three walls 44 of FIGS. 4 and 5, shown welded together end-to-end to form a three wall panel.

FIG. 7 is a perspective view with parts cut away of the wall 44 of FIGS. 4 and 5.

Figure 7A:
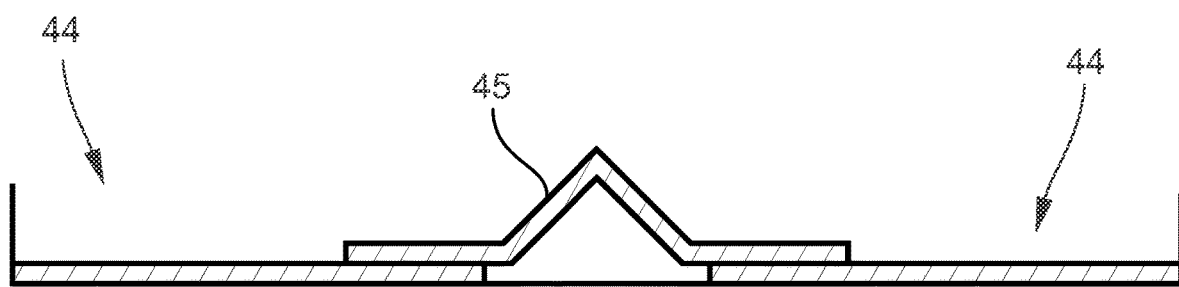
FIG. 7A is a cross-section of an expansion joint construction used to connect adjacent walls.

There are many different design features which can be used when the panels, for example, wall panels 44, are used for vertical slab walls, floor or roof components in a structure. FIG. 7A shows the use of an expansion joint 45 connected by welding adjacent vertical slab wall panels 44. The expansion joint 45 allows for movement of the structure due to expansion and contraction, but at the same time provides for the EMP and IEMI protective features to stay intact. The expansion joint 45 extends along the vertical length of the walls and spaces the adjacent wall panels 44 apart. The expansion joints 45 are connected by continuous welds. The outwardly-projecting face of the expansion joint 45 permits movement of adjacent wall panels 44 relative to each other. This movement is converted into a corresponding flexure of the expansion joint 45 in an outward and inward movement.

Figure 8:
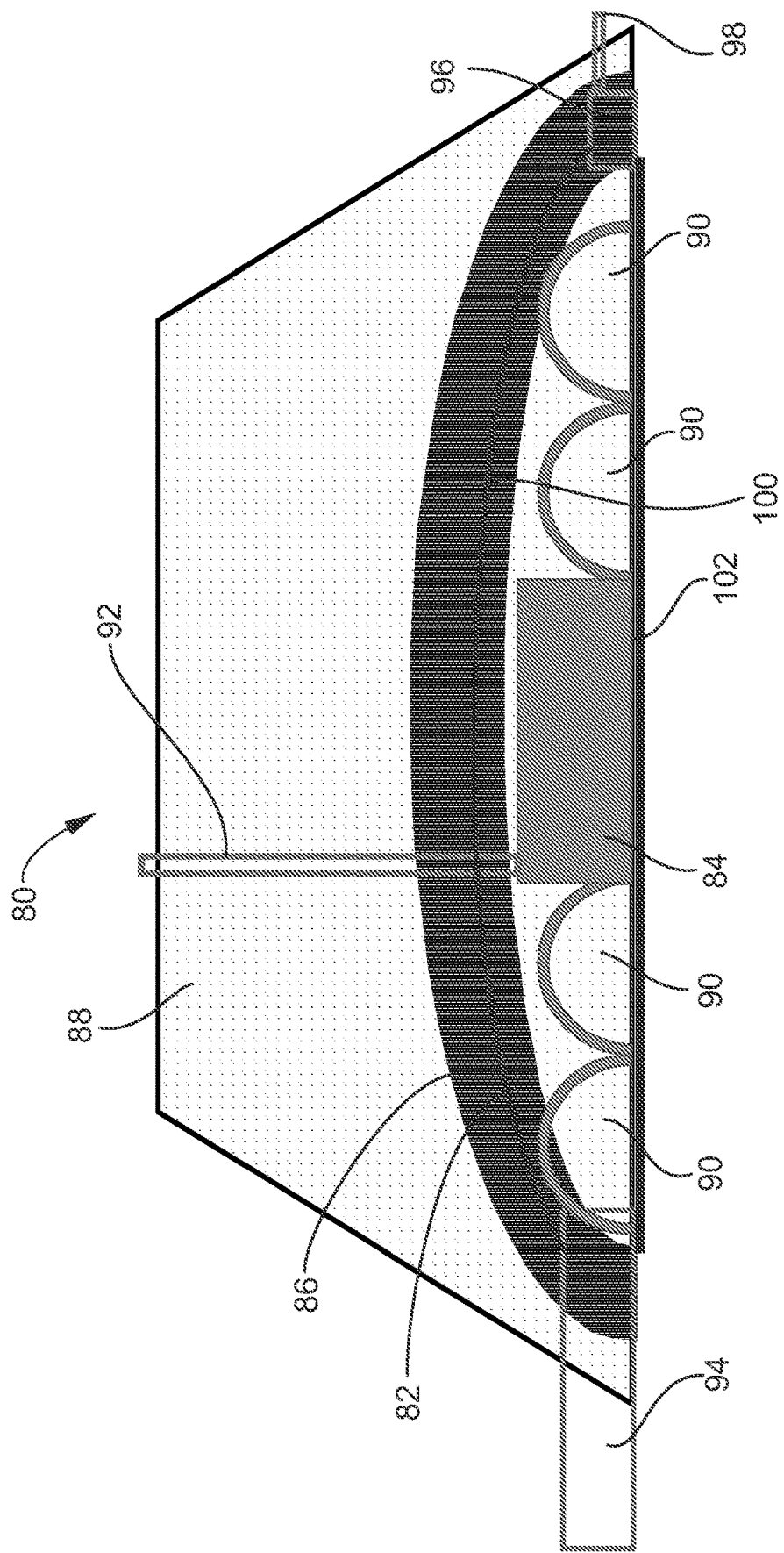
FIG. 8 is a schematic side elevation of an EMP Shielded facility incorporating coal combustion residuals and other EMP absorbing materials.

Referring now to FIG. 8, a schematic side elevation of an EMP Shielded structure 80 incorporating coal combustion residuals and other EMP absorbing materials. The design protects the structure 80 from damaging electromagnetic forces penetrating upwards from the ground or bottom portion into the interior spaces of the structure 80. The structure 80 includes a shallow arch 82 constructed of pre-cast or poured-in-places reinforced concrete. An occupancy area 84 is positioned in the center of the structure 80. Also formed of pre-cast or poured-in-places reinforced concrete and in the embodiment of FIG. 8 are a series of parallel arched structures 90 that sit under the shallow arch 82 and are filled with CCR. These structures 90 are overburdened with a relatively shallow layer of carbon-containing or carbon supplemented material 86, for example, containing 10 percent carbon, and a massively thick layer of CCR 88.

The structure 80 includes a shielded air intake 92, a shielded personnel/material entryway 94, a power filter vault 96, and a power entryway 98. Two layers of mesh shielding 100 reside within the relatively shallow layer of carbon-containing or carbon supplemented material 86. A floor plate 102, which may be steel plate, a mesh, or a combination of the two, provides primary protection against electromagnetic energy penetrating upwards from the ground or bottom portion into the interior spaces of the structure 80.

Figure 9:
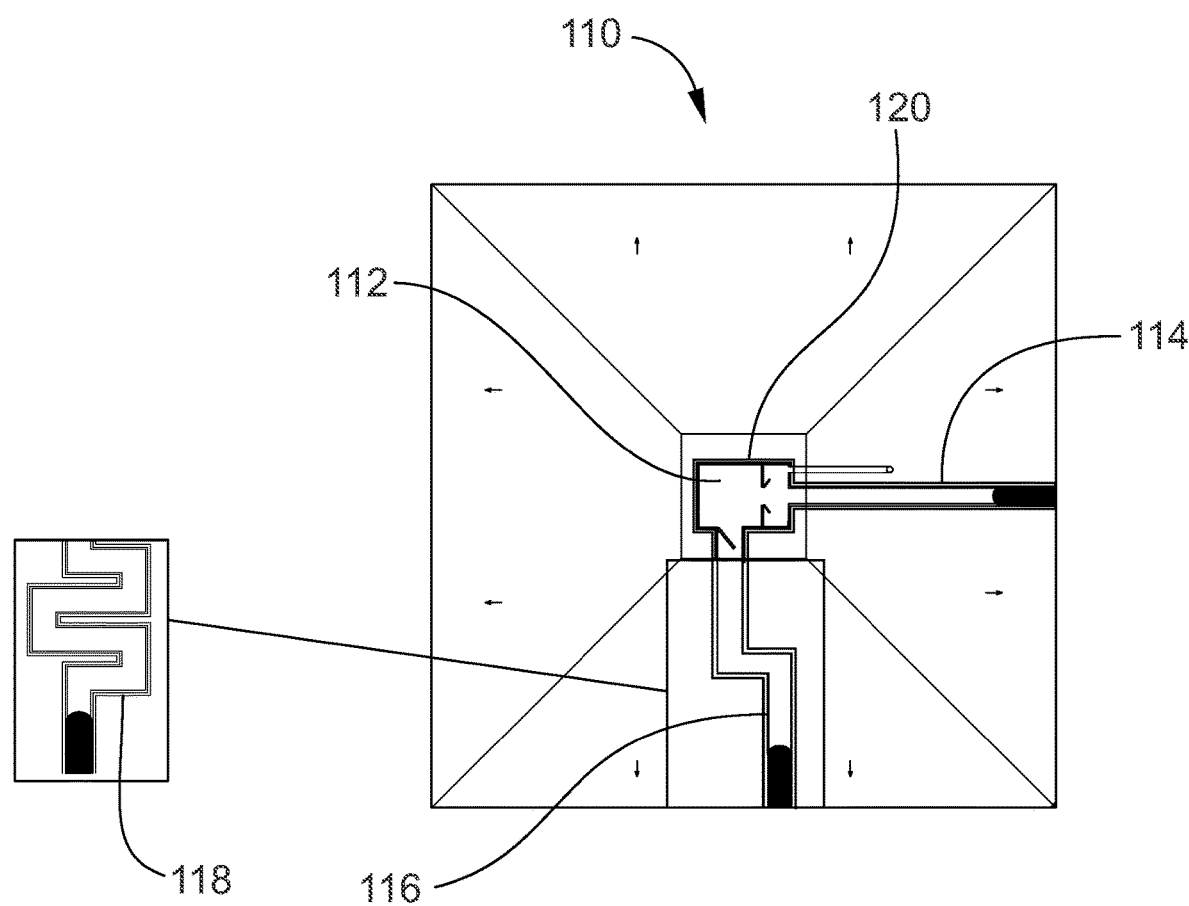
FIG. 9 is a top plan view of another protective structure incorporating EMP absorbing materials such as coal combustion residuals and coke breeze.
Figure 10:
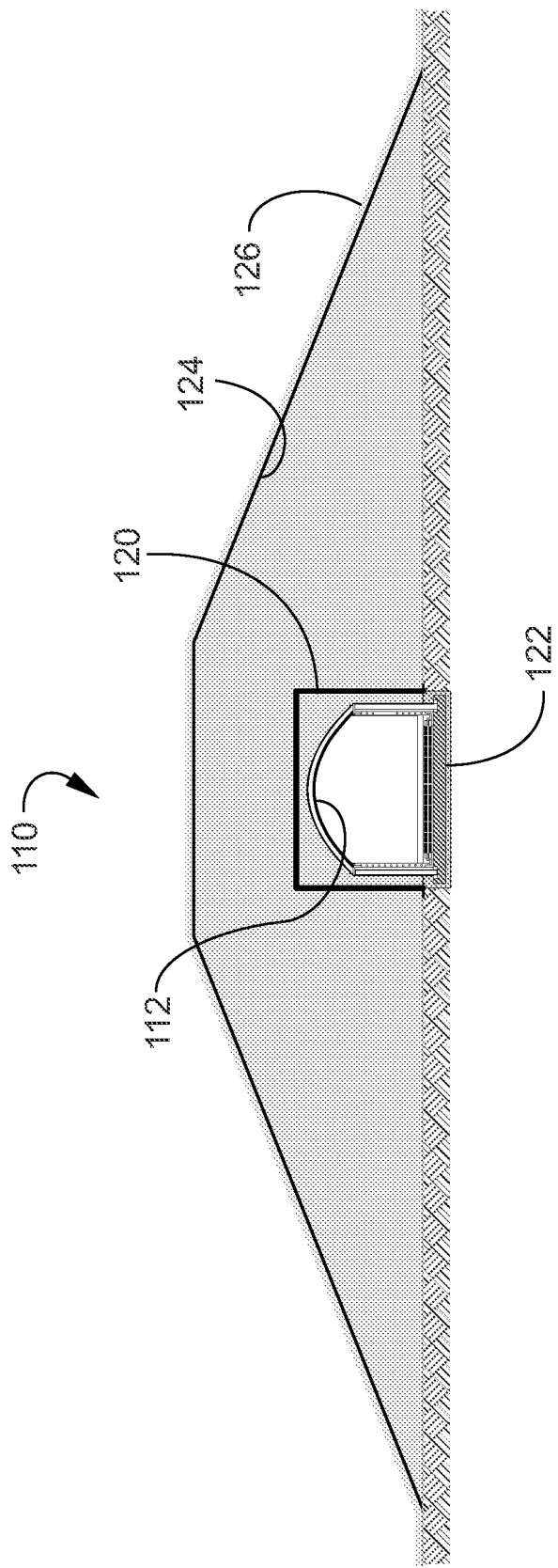
FIG. 10 is a side elevation of the protective structure shown in FIG. 9.

FIGS. 9 and 10 show a top plan and side elevation of another protective structure 110 incorporating EMP absorbing materials such as coal combustion residuals and coke breeze, by way of example, the structures shown in FIGS. 1-8 that provide enhanced protection, particularly for the sides and underside of the structures. The volume of the structure 110 is principally defined by CCR. A secure room 112 is accessed by a raceway 114 providing utilities and an emergency exit. An entryway 116 with a right angle jog provides normal ingress and egress. An alternative entryway 118 defines a labyrinth of right angle jogs that prevent electromagnetic intrusion. The entire secure room is surrounded by low frequency mesh shielding 120 as described above. As best shown in FIG. 10, the secure room 112 is protected from the bottom by a slab floor 122 containing coke breeze as an EMP absorbing material. The structure 110 may be covered with a HDPE cover 124, over which may be placed a vegetative cover 126 that provides temperature control and camouflage.

Figure 11:
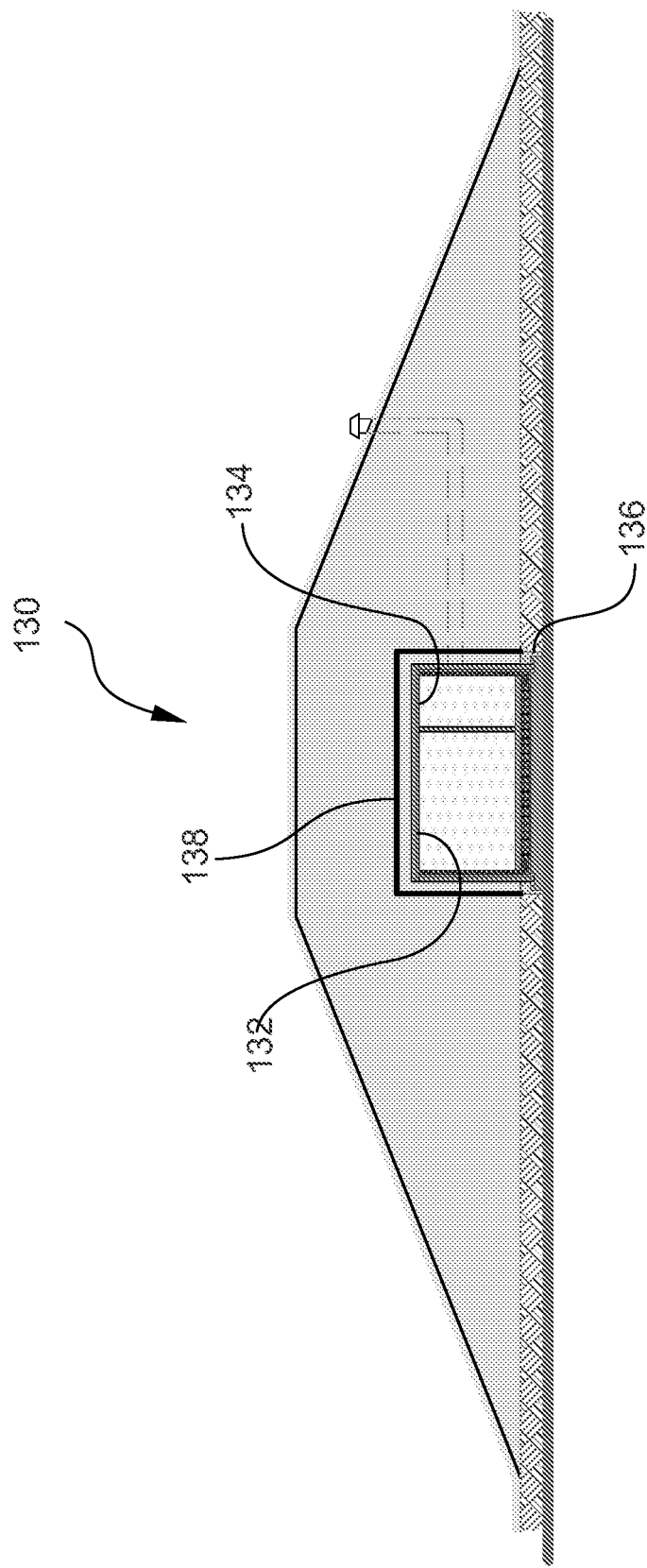
FIG. 11 is a side elevation of an alternative protective structure.

Referring to FIG. 11, an alternative protective structure 130 is shown, which has a volume defined principally by CCR. The sloped sides enclose secure rooms 132, 134 the bottom of which is protected by a slab 136 containing coke breeze. The perimeter of the rooms 132, 134 is surrounded by low frequency mesh shielding 138 as defined in this application.

Figure 12:
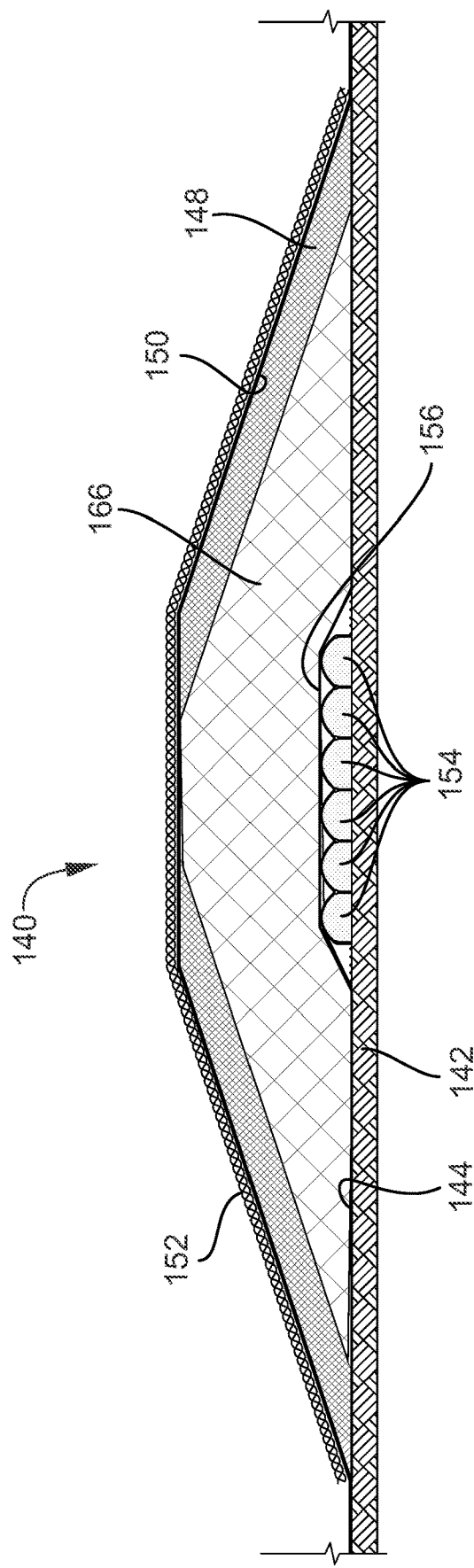
FIG. 12 is a side elevation of another alternative protective structure.

FIG. 12 is a side elevation of another alternative protective structure 140 and may be any desired size, including for example, 13.5 million cubic yards. The structure 140 rests on a conventional prepared subgrade foundation 142 covered with a liner system 144 that prevents any runoff from the structure 140 from entering the ground through the foundation 192. The principal component of the volume of the structure 140 is densely-compressed CCR 146 that is encapsulated under a reinforced CCR cap 148. A liner system covering 150 encloses the CCR 146 and CCR cap 148. All or part of the structure 140 may be covered with soil and vegetation 152.

As shown in FIG. 12, the structure 140 has severely-sloped sidewalls designed to deflect a blast proximate the structure 140. The structure 140 is adapted to store, for example, bulk storage items in separate reinforced rooms 154 protected by a further reinforced enclosure 156. Rooms 140 and the reinforced enclosure 156 are constructed according to the construction principles utilizing the composite enclosure panel system identified in this application to achieve an EMP-protected area within the structure 140.

Figure 13:
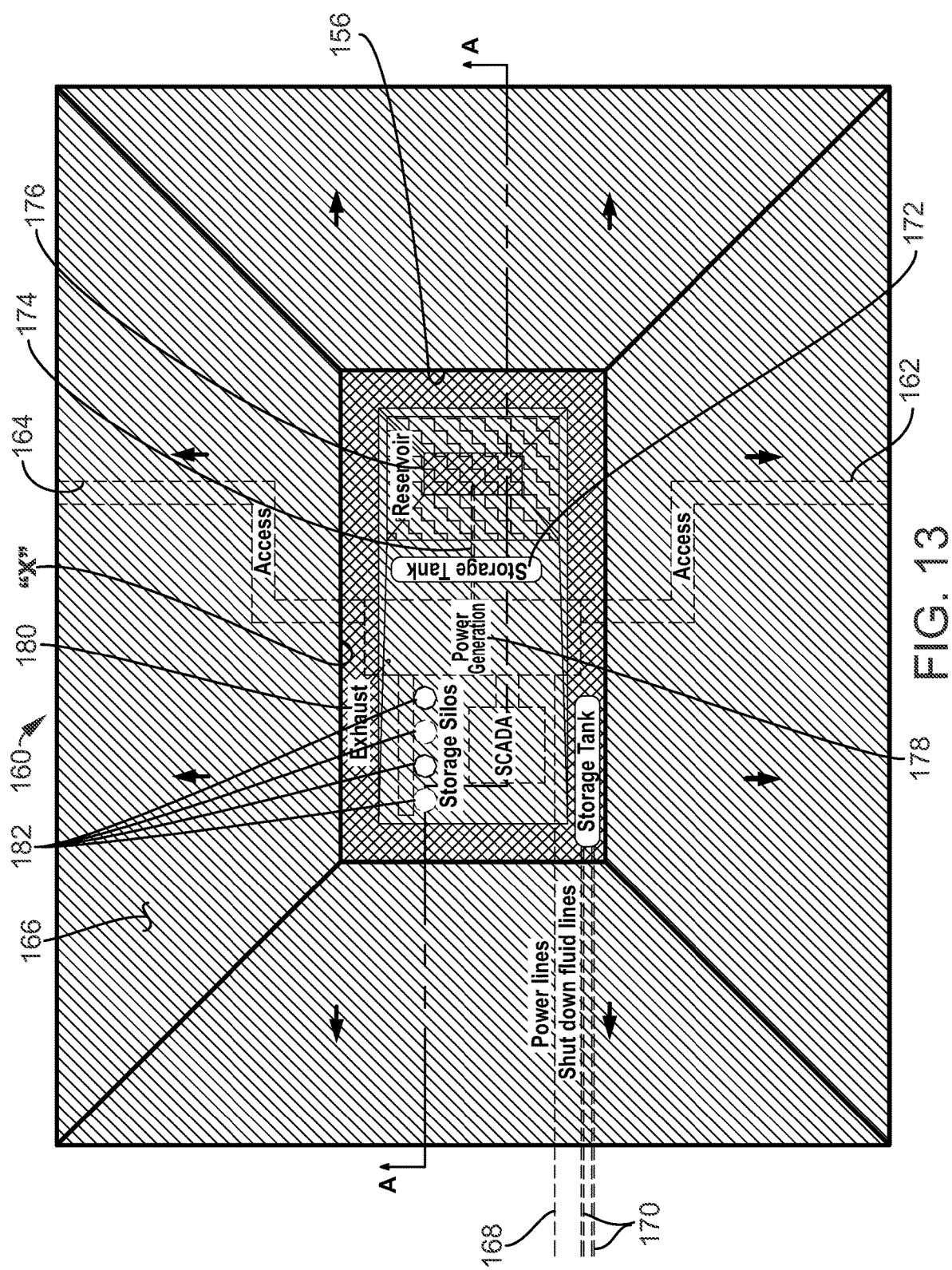
FIG. 13 is a top plan view of a protective structure showing details of secure room facilities.
Figure 14:
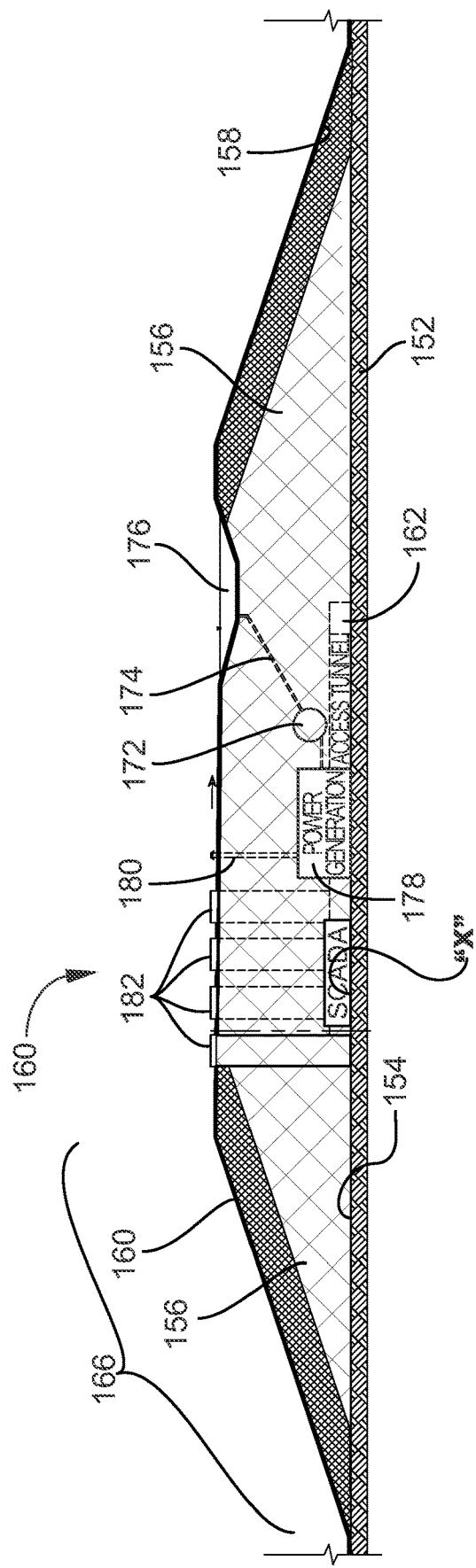
FIG. 14 is a side elevation of a protective structure showing details of secure room facilities.

FIGS. 13 and 14 are a top plan view and side elevation of a protective structure 160 showing details of secure room facilities that include labyrinth-type ingress/egress access tunnels 162, 164 within sloping walls 166 that connect the exterior of the structure 160 with the interior "X" of the structure 160. The interior "X" of the structure 160 includes necessities for sustaining life for an extended time, including lines 168 delivering electric power to the structure 160, fluid lines 170 for delivering and conveying away water, sewage and the like, a water storage tank 172 that can be gravity fed when necessary through a feed line 174 from a reservoir 176. Electric power can be generated by a generator 178 when current from exterior the structure 160 is not available. Combustion gases from the generator 178 and ventilation of other gases is by an exhaust stack 180. Storage silos 182 provide storage for food, water and any other materials that are required.

Figure 15:
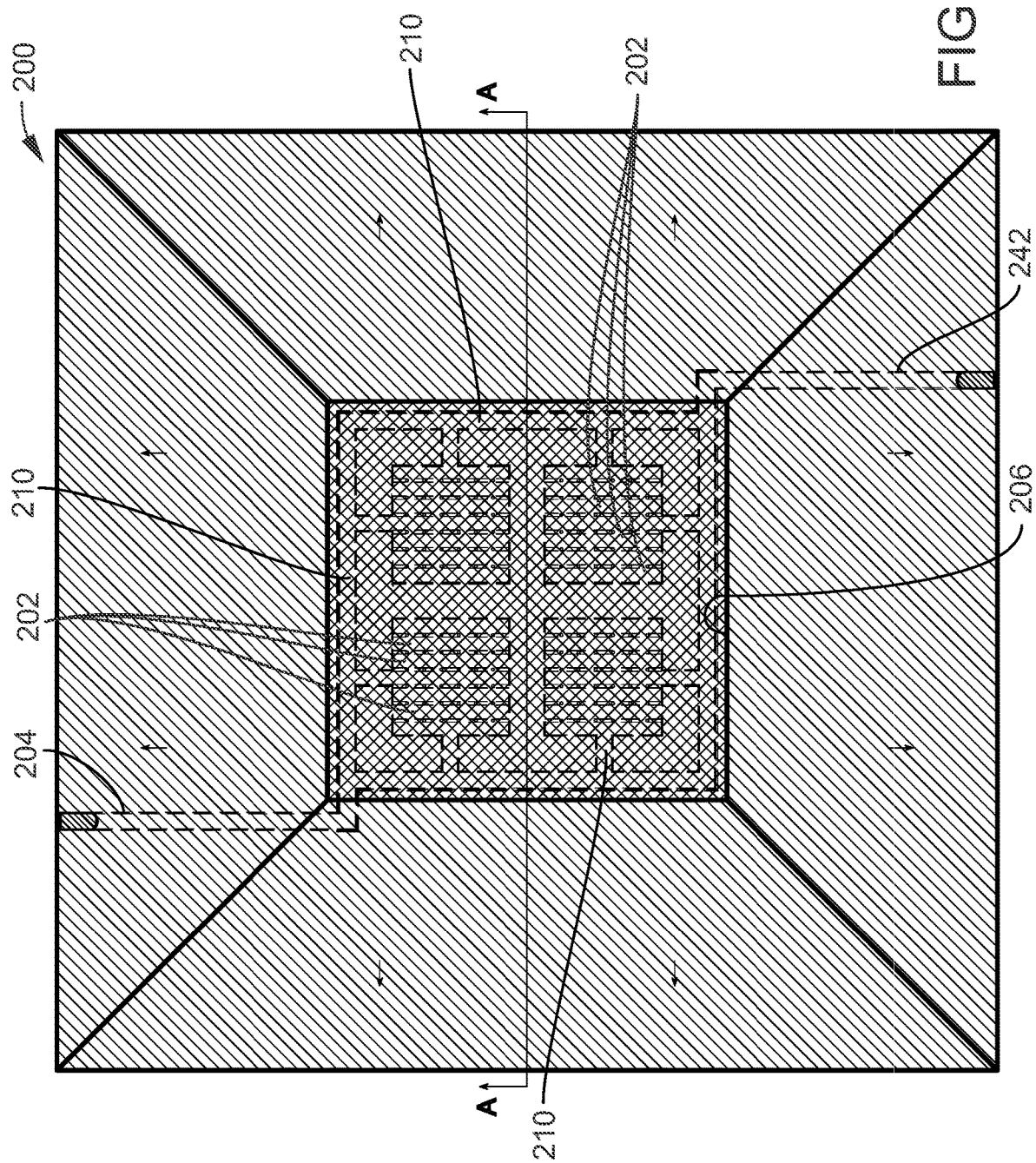
FIG. 15 is a top plan view of an alternative protective structure indicating secure rooms protected by the structure.

FIG. 15 is a top plan view of an alternative protective structure 200 indicating secure rooms 202 protected by the structure 200. This structure 200 may be any desired size, including for example, 13.5 million cubic yards comprising compacted CCR. Continued reference to FIG. 15 indicates labyrinth-type ingress/egress access tunnels 204, 206 that connect the exterior of the structure 200 with the rooms 202. The rooms 202 are connected by passageways 210 that connect with the access tunnels 204, 206.

Figure 16:
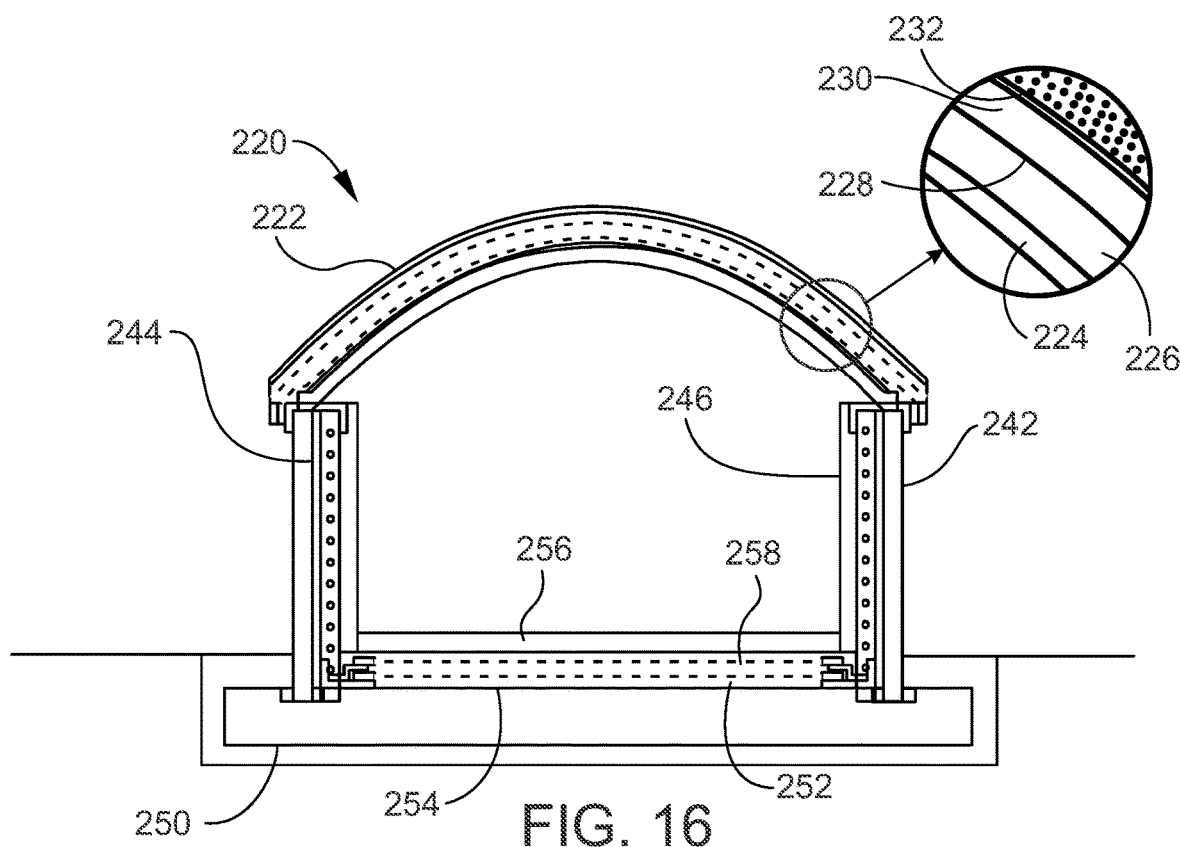
FIGS. 16 and 17 are side elevations of a dome-shaped EMP protective structure.
Figure 17:
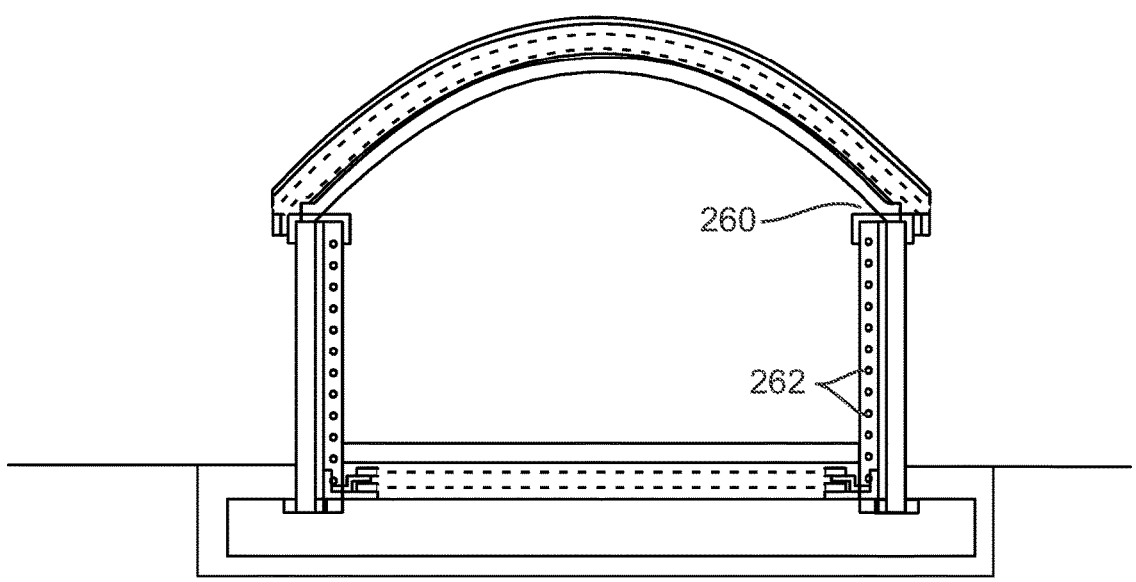

Further details of the manner in which various CCR structures are provided with enhanced EMP protection are shown in FIGS. 16 and 17. In FIG. 16 a protective structure 220 is enclosed within a larger structure comprising compacted CCR, as described and shown above. The structure 220 includes an arched roof 222 formed of layers of specific materials designed to provide enhanced protection against EMP. An innermost steel plate 224 provides structural support for a concrete layer 226, which is overtopped by a layer 228 of waterproofing, and a layer 230 of EMP absorbing coke breeze. A vapor barrier 232, for example HDPE encloses the entire roof 222.

The sidewalls 240 of the structure 220 include an exterior concrete structure 242 supported by a metal casement 244. A further secondary non-structural carbon heavy concrete layer 246 provides innermost protection. The base of the structure 220 is supported on crushed stone, for example, a six-inch bed 250 of ⅞ inch stone. A mat foundation 252 enclosed within a vapor barrier 254 supports the sidewalls 240. The mat foundation 252 supports a slab 256 formed of, for example, an 8 inch layer of EMP absorbing coke breeze. The coke breeze slab 256 includes embedded EMP absorbing mesh 258 extending throughout the length and width of the slab 256.

Further details of the metal casement 244 are shown in FIG. 17, and include continuous welds 260, holes for rebar placement 262, and mesh 258 with flat bars 264.

Figure 18:
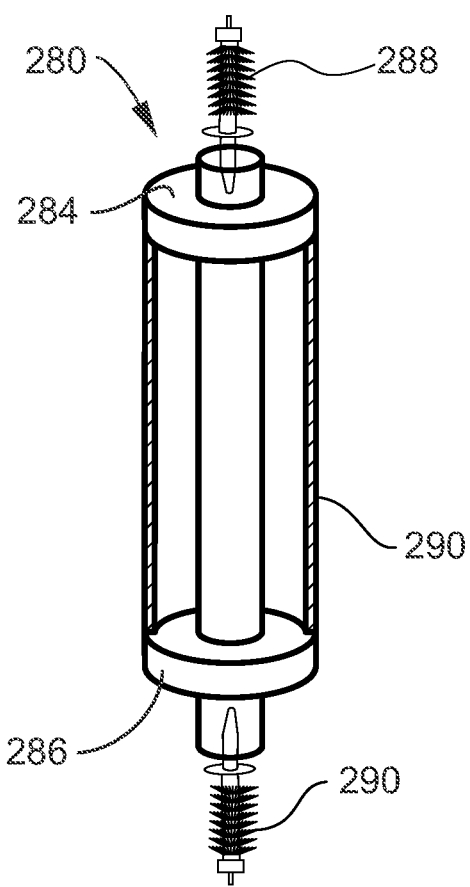
FIG. 18 is a perspective view of a carbon-based radio frequency (RF) filter.
Figure 19:
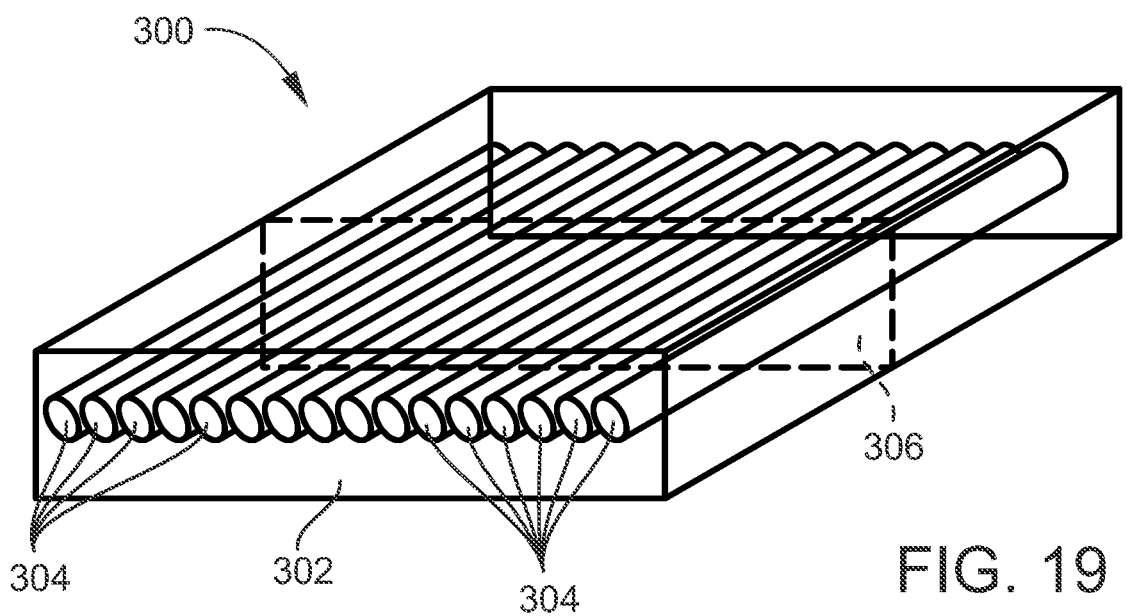
FIG. 19 is a view of a filter element of the carbon-based radio frequency (RF) filter of FIG. 18.
Figure 20:
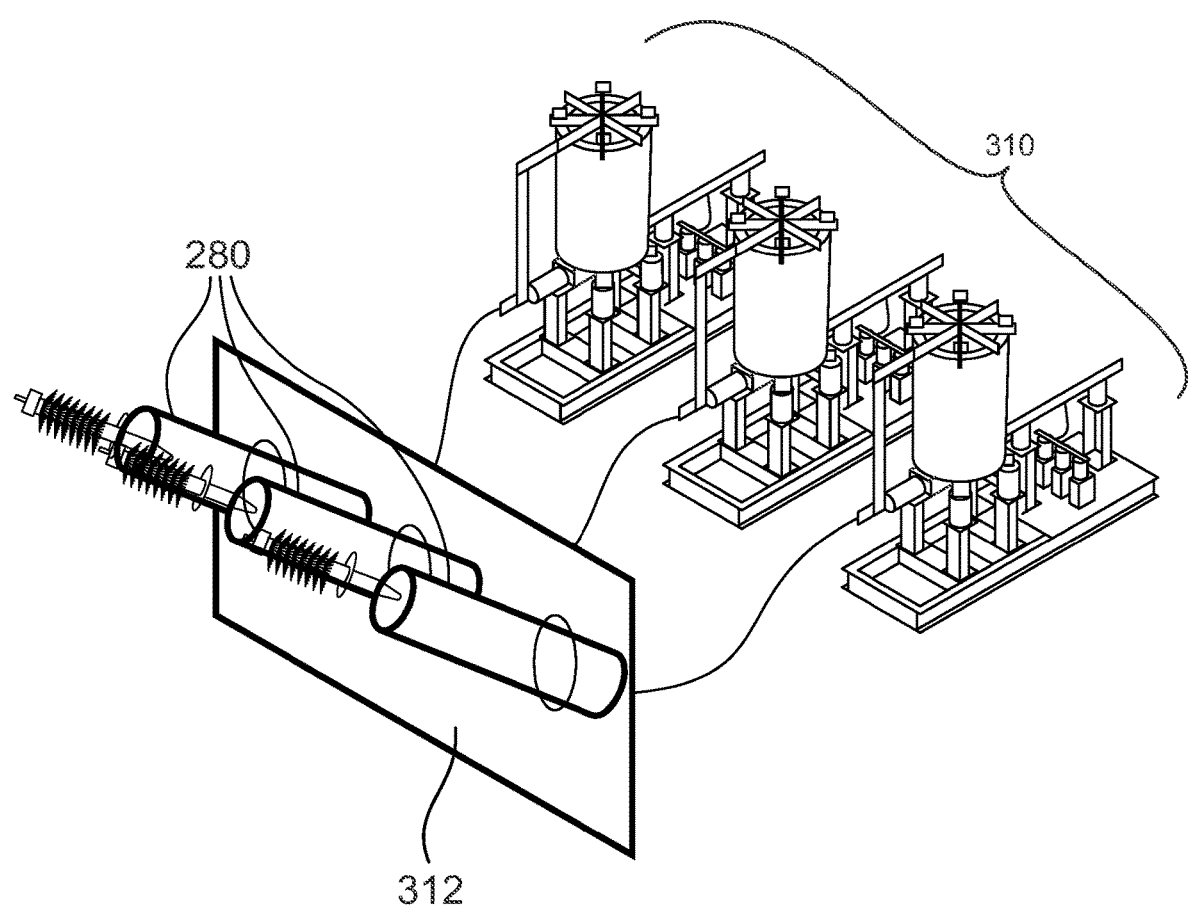
FIG. 20 is a perspective view of an application of a filter element of a carbon-based radio frequency (RF) filter according to FIGS. 18 and 19.

Referring now to FIGS. 18, 19 and 20, the use of carbon and carbon-containing materials for the purposes of absorbing and/or removing radio frequency ("RF") energy from wires, cables, conduits, pipes, electrical conductors or other metallic fixtures. The RF energy can come from a High-Altitude Electromagnetic Pulse ("HEMP" or "EMP") that is absorbed and conducted along conductive element, energy generated with an electronic device that is directly connected to a conductive element such as a wire, power conductor, or utility feeder commonly known as an Intentional Electromagnetic Interference ("IEMI") device, or energy that is absorbed and conducted along a conductive and/or metallic element from an IEMI device that is connected to an antenna that radiates IEMI energy so that a wire, cable, conduit, pipe, electrical conductor, or metallic fixture absorbs and conducts this potentially harmful energy.

A carbon RF reduces conducted RF energy on a conductor, whether directly superimposed on the conductor, or whether superimposed onto a conductor through free-space or other material. This carbon may be CCR, graphite, coke breeze, PET coke, calcined coke, or other carbon-containing material that is capable of absorbing RF energy. The carbon containing material may be configured in mats or sheets, it may be in granular form in various particle sizes, or it may be in any other form, provided it has the RF absorbing characteristics. Embedding a conductor in carbon-containing materials can act as an absorber of RF energy that travels along the conductor. This effect is such that a conductor thus configured acts as a filter, allowing the passage of intended low-frequency signals, such as electrical power in alternating current, or direct current forms, or low frequency signals such as those used in some sensors and actuator controls.

One specific embodiment of this feature is in electrical power into an RF shielded structure (this can include a HEMP shielded structure, an IEMI shielded structure, or a combination of both or any other structure that is designed to limit the incursion of RF energy into a protected/shielded space. A structure that has other applications (such as an "All-Hazard Total Protective Structure") may also be RF shielded. Such a filter constructed in this way can be effective at different voltages, even voltages commonly referred to in electrical utility terms as "Low-Voltage", "Medium-Voltage" or "High-Voltage" intended to refer to voltages from 0 Volts to voltages measured in the hundreds of thousands of volts or higher.

For example, a power line that is run through a carbon RF filter of this type will pass 60 Hz AC or Direct Current but will significantly reduce RF energy that may be intentionally or unintentionally travelling along the same conductor. This differs significantly from a typical RF filter that may be comprised of inductors and capacitors as commercially available because these filters will generally have some loss associated with their use. The carbon RF filter is a significant improvement over conventional filter technologies in that losses are eliminated other than those that are typically experienced in the same conductor not embedded in carbon-containing material for the purposes of carrying electrical current.

The filter may or may not be constructed so that conductors pass into a metallic enclosure (with proper insulation and electrical stress protection on the conductor entry and exit) that holds carbon containing material. In the event of an electrical fault, any current will be safely contained within the enclosure and safely allow for the "fault" to be cleared by typically used electrical equipment, such as fuses or breakers or other protection means. This type of shielding is required for conductors above a certain voltage level.

Conductors embedded in carbon may include those typically available from electrical conductor vendors, or it may be a specially designed conductor that is specially insulated inside of a nylon or PVC (or other electrical insulating material) tube. The use of SF6 (sulfur hexafluoride) or dry air or other material or gas may be used to create an insulating barrier inside of a non-conductive enclosure or pipe that allows for a metallic busbar (such as copper) to be embedded in carbon-containing material. The conductors, when appropriate as dictated by the electrical code, may be embedded directly in carbon-containing material with no specific enclosure.

The carbon containing material may be in a mat or sheet form and may be wrapped around individual conductors to provide RF absorbing/filtering characteristics.

As shown in FIG. 18 an RF filter 280 includes steel or other ferrous or non-ferrous conductive pipe 282 enclosed on both ends by steel or non-conductive threaded end caps 284, 286. The end caps 284, 286 include openings through which extend respective bushings 288, 290, which may be electrical stress-protected connectors. The bushings 288, 290 connect with an electrically-conductive cable 292 that extends through the length of the filter 280. The cable 292 may be insulated, or may be a dielectric/insulating insert with the cable 292 extending through the insert. The pipe 282 defines a void, and the void is filled with carbon-containing materials, as described above, to provide high-frequency filtering. Multiple elements can be arranged to act as RF filters for 3-phase power, DC power from photovoltaics as examples, but not the only possible applications.

FIG. 19 illustrates another possible RF filter 300 that utilizes a metal box 302 in which an array of conductors 304 is positioned. The exterior of the box 302 is provided with an RF attenuating barrier 306, such as a mesh as described in this application. The box is filled with a carbon-containing RF absorbing material such as coke breeze or one of the other carbon-based materials described above.

Referring now to FIG. 20, the above-described RF filters 280, and 300, not shown, can be used for applications like electric power substation 310 where multiple conductors 280 may pass from an unshielded area through a shield barrier 312 to a shielded area of the substation 310, and applications (such as high-speed protective relays) that may not be compatible with conventional filters. Grounding shields from the cables would be removed for the portion of the conductors that pass through the carbon containing absorbing material. However the carbon RF filter 180 or 200 is utilized it will be configured so that one end is outside of the shielded environment, and the other end is inside the shielded environment, as shown in FIG. 20. Inside of the RF shielded environment, other protective devices, such as metal-oxide varistors may be employed to reduce any remaining RF artifacts.

Transient suppression devices can take on many forms from arc contacts, to filters, to solid state semiconductor devices. Discrete semiconductor transient suppression devices such as the Metal-oxide Varistor, or ("MOV"), are by far the most common as they are available in a variety of energy absorbing and voltage ratings making it possible to exercise tight control over unwanted and potentially destructive transients or over voltage spikes. With higher frequency RF artifacts removed, MOV's may be effectively employed. Often when high-frequency artifacts are present, an MOV does not act fast enough to protect against conducted RF energy that may be damaging. With the higher frequency artifacts removed, the "rise time" of any RF energy will be significantly less, allowing for conventional and/or less expensive MOV's that have a slower rise-time response to be used to provide more effective protection to a conductor in a shielded environment.

One of the technical principles employed with this invention is called the "Skin Effect". The skin effect is the tendency of an alternating current, such as standard utility power and radio frequency energy, to become distributed within an electrical conductor in a way that the current is mostly carried near the surface of a conductor ("the skin" of the conductor). The depth of the "skin" is dependent upon frequency of the electrical current—so DC power would utilize the whole conductor, utility AC power would have very limited skin effect, because it is low in frequency, and RF energy from an EMP or IEMI or other RF source would flow mainly on the outside of a conductor. By flowing on the outside of the conductor, the RF energy is closer to the carbon-containing material that absorbs the RF energy. This allows the RF energy to be removed from the conductors as it propagates across the conductor. Another technical principle employed with this invention is "re-radiation" of RF energy that is travelling down a conductor. As RF energy frequency increases, the tendency for RF energy to reradiate from conducted energy to energy traveling in free-space (or within some other medium in which a conductor is placed) as it travels along the conductor. When the energy reradiates in carbon-containing material, it is converted to heat by the carbon, which is the same principle that pyramidal carbon absorbers, commonly used in "anechoic chambers" or EMI testing chambers.

For applications with utility AC power or DC power from alternative energy (as examples, but not limited to these examples) the carbon-containing RF absorber will absorb any energy that is reradiated from a conductor inside of it. The effectiveness of the carbon-containing RF absorber will be dependent on the thickness of the RF absorber, with higher frequencies, having a shorter wavelength, being absorbed by a shorter thickness of carbon material in which a given conductor may be embedded than for lower frequencies, with a longer wavelength.

Figure 21:
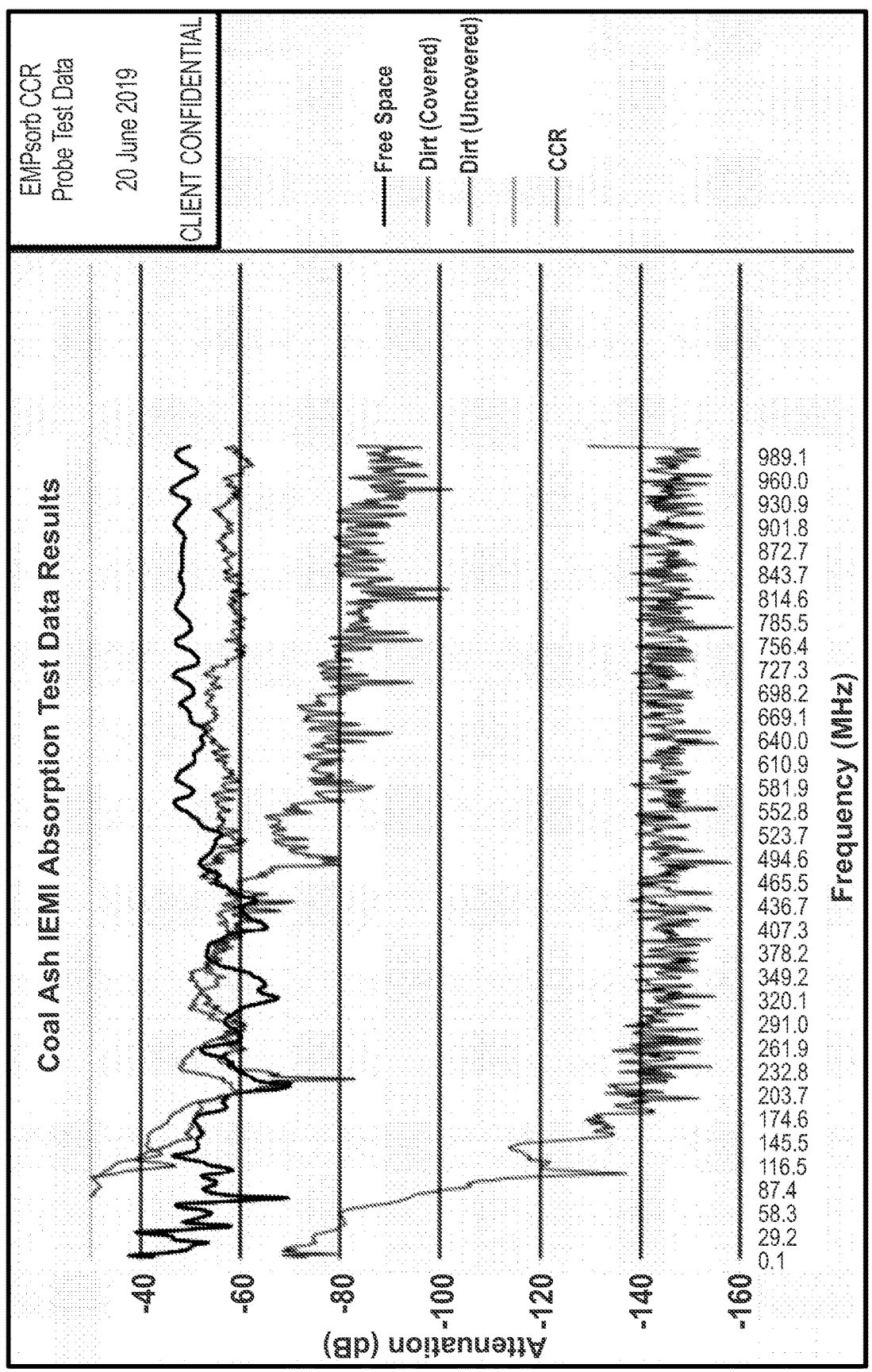
FIG. 21 is a table showing Coal Ash IEMI Absorption test data results.
Figure 22:
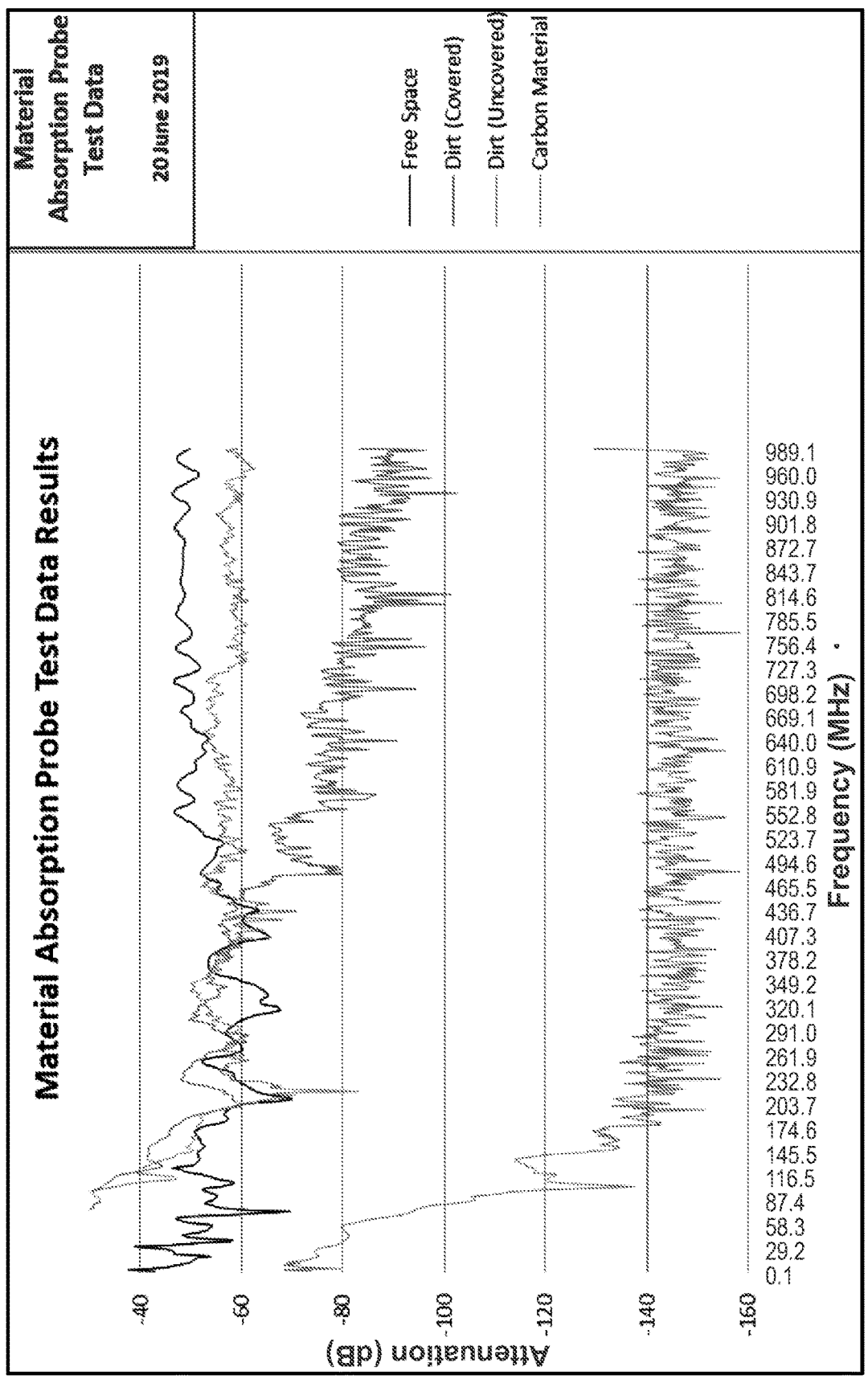
FIG. 22 is a table showing Material Absorption probe test data results.

FIGS. 21 and 22 are tables showing Coal Ash IEMI Absorption test data results and Material Absorption probe test data results, respectively.

Referring now to FIGS. 23, 24, 25 and 26, alternatives to the fully enclosed CCR structures disclosed above are explained. In some circumstances it may be impractical to enclose large facilities fully with vast quantities of CCR. In such circumstances large facilities, for example, utility power stations, military structures and similar facilities can be positioned within an open berm structure. The berm structure can provide protection against low level, low angle EMP by deflecting the EMP up and over the facilities within the open berm structure.

For example, a berm 340 is shown in cross-section and has an isosceles or three sides equal trapezoid shape, with a relatively wide base 342, opposed inner and outer sloped walls 344, 346 surmounted by a relatively narrow top 348. The top 348 may be configured as a roadbed along which security or service vehicles may travel. The volume of the berm 340 is comprised of compacted CCR and other EMP absorbing materials, as described above. The berm may include communications equipment, such as radio transmission antennae, 350. The base 342 of the berm 340 may be protected using the enclosure techniques described above, including the use of coke breeze materials, vapor barriers, steel and concrete.

Figure 23:
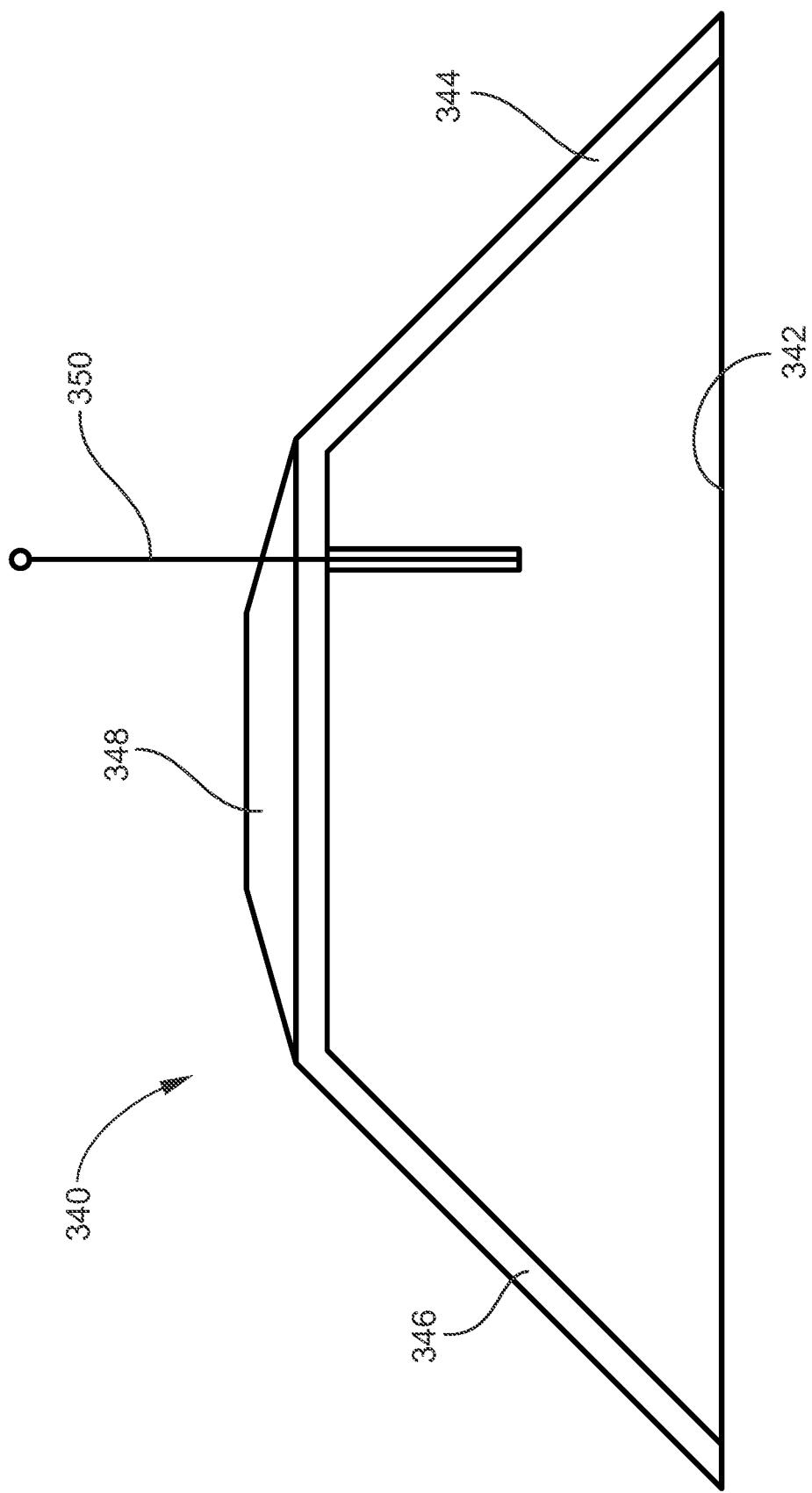
FIG. 23 is a vertical cross-section of an elongate EMP protective berm incorporating coal combustion residuals and other EMP absorbing materials.
Figure 24:
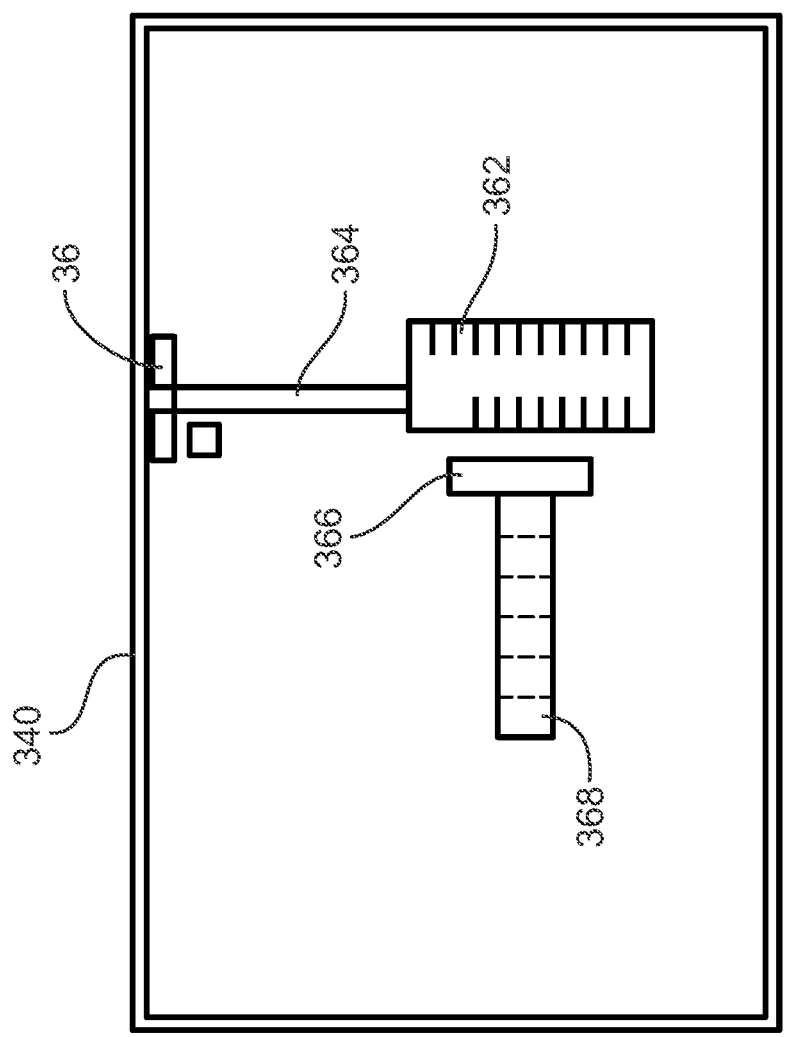
FIG. 24 is a top plan view of a secure compound surrounded by an elongate EMP protective berm according to FIG. 23.

Referring to FIG. 24 is a top plan view of a secure compound surrounded by the elongate EMP protective berm 340 according to FIG. 23. The berm 340 defines a secure perimeter with an ingress/egress 360. Vehicles access a parking lot 362 via a driveway 364. The compound can include any desired structures, for example offices 366 and warehouses 368. The height of the perimeter berm 340 is determined by the height of the structures within the enclosure of the berm 340. Ideally, the height of the berm 340 will be at least as high as or higher than the highest structure within the perimeter.

Figure 25:
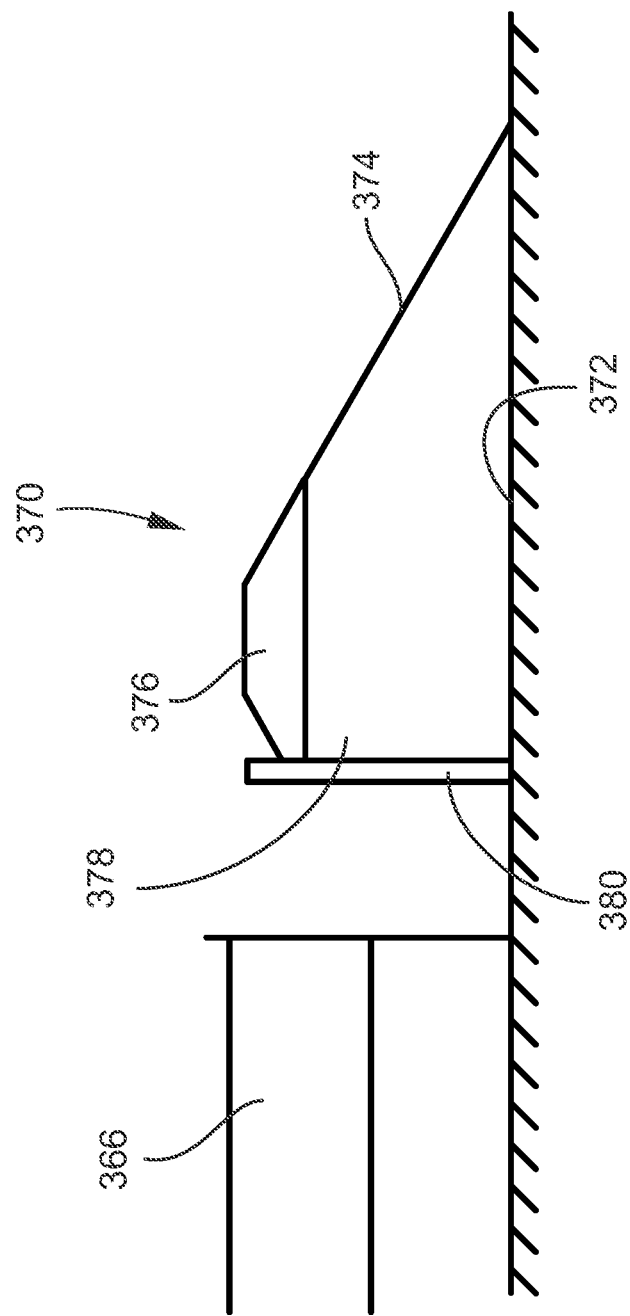
FIG. 25 is a partial vertical cross-section of a secure compound surrounded by an elongate EMP protective berm according to another embodiment.

FIG. 25 is a partial vertical cross-section of a secure compound surrounded by an elongate EMP protective berm 370 according to an alternative embodiment having a right isosceles shape with a wide base 372, outwardly facing, protective sloping side 374 surmounted by a relatively narrow top 376. The top 376 may serve as a roadbed. The inner wall 378 is vertical and thus occupies less interior space than other designs. The vertical inner wall 378 may be supported by a separate barrier wall 380. As with the other berm embodiments, the volume of the berm 370 is comprised of compacted CCR and other EMP absorbing materials, as described above.

Figure 26:
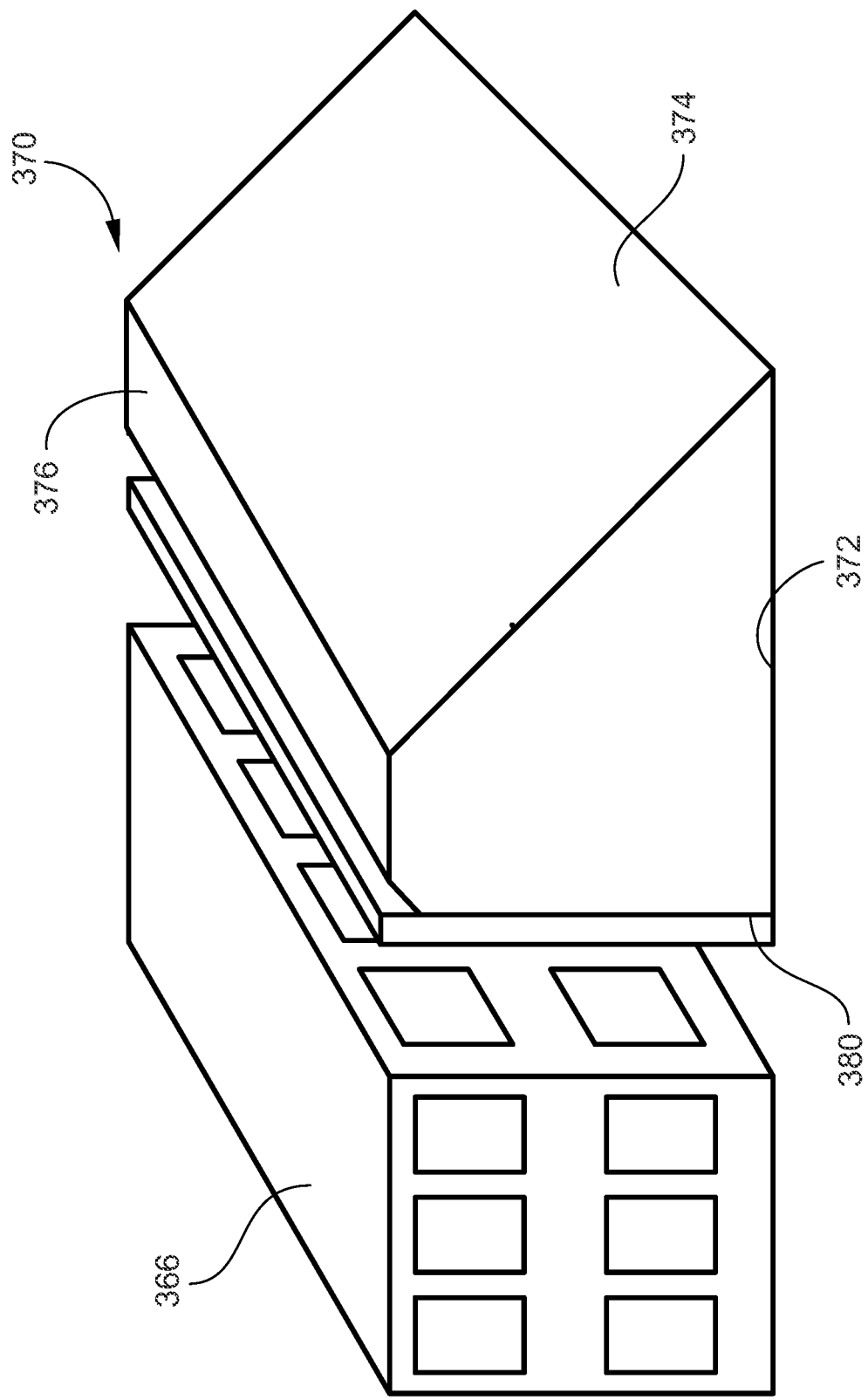
FIG. 26 is a perspective view of the secure compound of FIG. 25.

FIG. 26 is a perspective view of the secure compound and berm 370 of FIG. 25.

An electromagnetic emission shield for protecting a coal combustion residue facility according to the invention have been described with reference to specific embodiments and examples. Various details of the invention may be changed without departing from the scope of the invention. Furthermore, the foregoing description of the preferred embodiments of the invention and best mode for practicing the invention are provided for the purpose of illustration only and not for the purpose of limitation, the invention being defined by the claims.

What is claimed is:

1. A structural panel for use in constructing an EMP-protective composite structure, the structural panel comprising:
    (a) an uninterrupted ferrous back panel covering and enclosing a first major surface of the structural panel;
    (b) a plurality of studs welded to an inner side of the uninterrupted ferrous back panel;
    (c) a plurality of reinforcing members comprising a grid formed of a mutually-interlocking array of a plurality of elongate elements;
    (d) a cementitious layer poured on the inner side of the uninterrupted ferrous back panel in which the plurality of studs and the elongate elements are embedded; and
    (e) an absence of any ferrous side members permanently connected to the uninterrupted ferrous back panel.

2. The structural panel of claim 1, wherein the grid is an EMP absorbing mesh embedded in the cementitious layer.

3. The structural panel of claim 1, wherein the structural panel includes an expansion joint extending along a major side thereof for joining the structural panel to a like structural panel that allows for movement of the structural panel relative to other joined structural panels due to expansion and contraction while maintaining intact EMP protective features.

4. The structural panel of claim 3 further comprising an insulation layer coextensive with a major surface of the panel.

5. The structural panel of claim 1 wherein the cementitious layer is selected from the group consisting of normal weight concrete, lightweight concrete, epoxy concrete, ultra-high performance concrete, and autoclave concrete.

6. The structural panel of claim 1 wherein the plurality of elongate elements defines a mesh.

7. The structural panel of claim 6 wherein the mesh is a wire mesh.

8. The structural panel of claim 1 wherein plurality of elongate elements is a plurality of rebar.

* * * * *